(12) United States Patent
Mita

(10) Patent No.: US 7,681,998 B2
(45) Date of Patent: Mar. 23, 2010

(54) LAMINATED PIEZOELECTRIC ELEMENT, LIQUID DROPLET EJECTION HEAD USING SAME, AND IMAGE FORMING APPARATUS COMPRISING SAME

(75) Inventor: Tsuyoshi Mita, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 363 days.

(21) Appl. No.: 11/142,333

(22) Filed: Jun. 2, 2005

(65) Prior Publication Data
US 2005/0270340 A1    Dec. 8, 2005

(30) Foreign Application Priority Data
Jun. 2, 2004    (JP) .............................. 2004-164515

(51) Int. Cl.
*B41J 2/045*    (2006.01)
(52) U.S. Cl. .......................................... 347/71; 347/72
(58) Field of Classification Search .............. 347/70–72
See application file for complete search history.

(56) References Cited

U.S. PATENT DOCUMENTS 5,402,159 A * 3/1995 Takahashi et al. .............. 347/9
6,575,565 B1 * 6/2003 Isono et al. ..................... 347/71
6,670,659 B1 * 12/2003 Gudesen et al. ............. 257/295

FOREIGN PATENT DOCUMENTS

| JP | 01130951 A | * | 5/1989 |
| JP | 3-261560 A | | 11/1991 |
| JP | 8-11304 A | | 1/1996 |

* cited by examiner

*Primary Examiner*—Matthew Luu
*Assistant Examiner*—Lisa M Solomon
(74) *Attorney, Agent, or Firm*—Birch, Stewart, Kolasch & Birch, LLP

(57) ABSTRACT

The laminated piezoelectric element comprises a plurality of layers including first electrodes, piezoelectric material bodies, and second electrodes, wherein: the layers are laminated in order of the first electrode, the piezoelectric material body, the second electrode, and the piezoelectric material body; a plurality of active parts of the laminated piezoelectric element, where the piezoelectric material bodies are capable of actively expanding and contracting when a voltage is applied to the first electrode and the second electrode that are mutually opposing across the piezoelectric material body, are two-dimensionally arranged in a row direction and a column direction; and the first electrodes are common to the plurality of active parts in the row direction and the second electrodes are common to the plurality of active parts in the column direction.

10 Claims, 19 Drawing Sheets

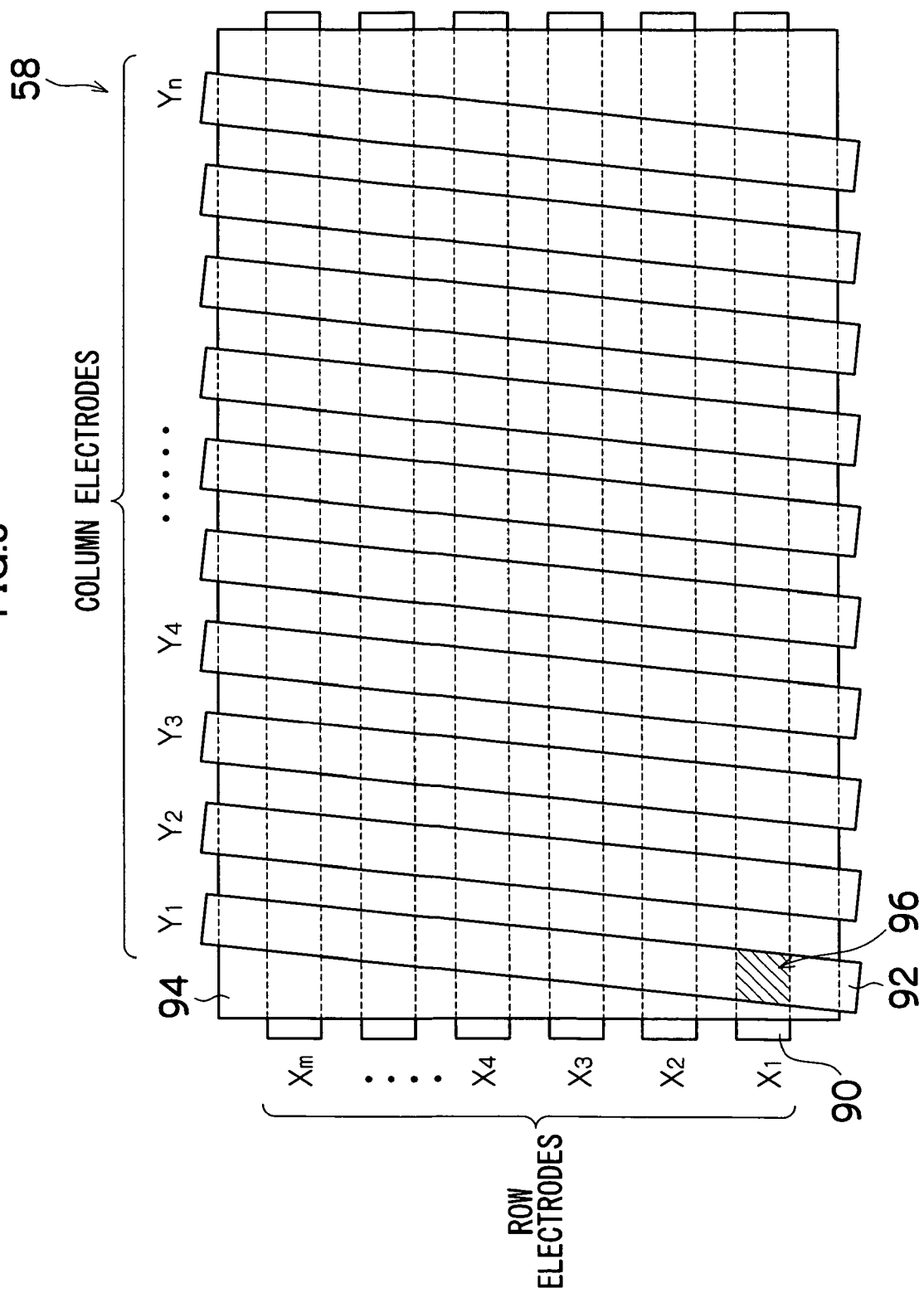

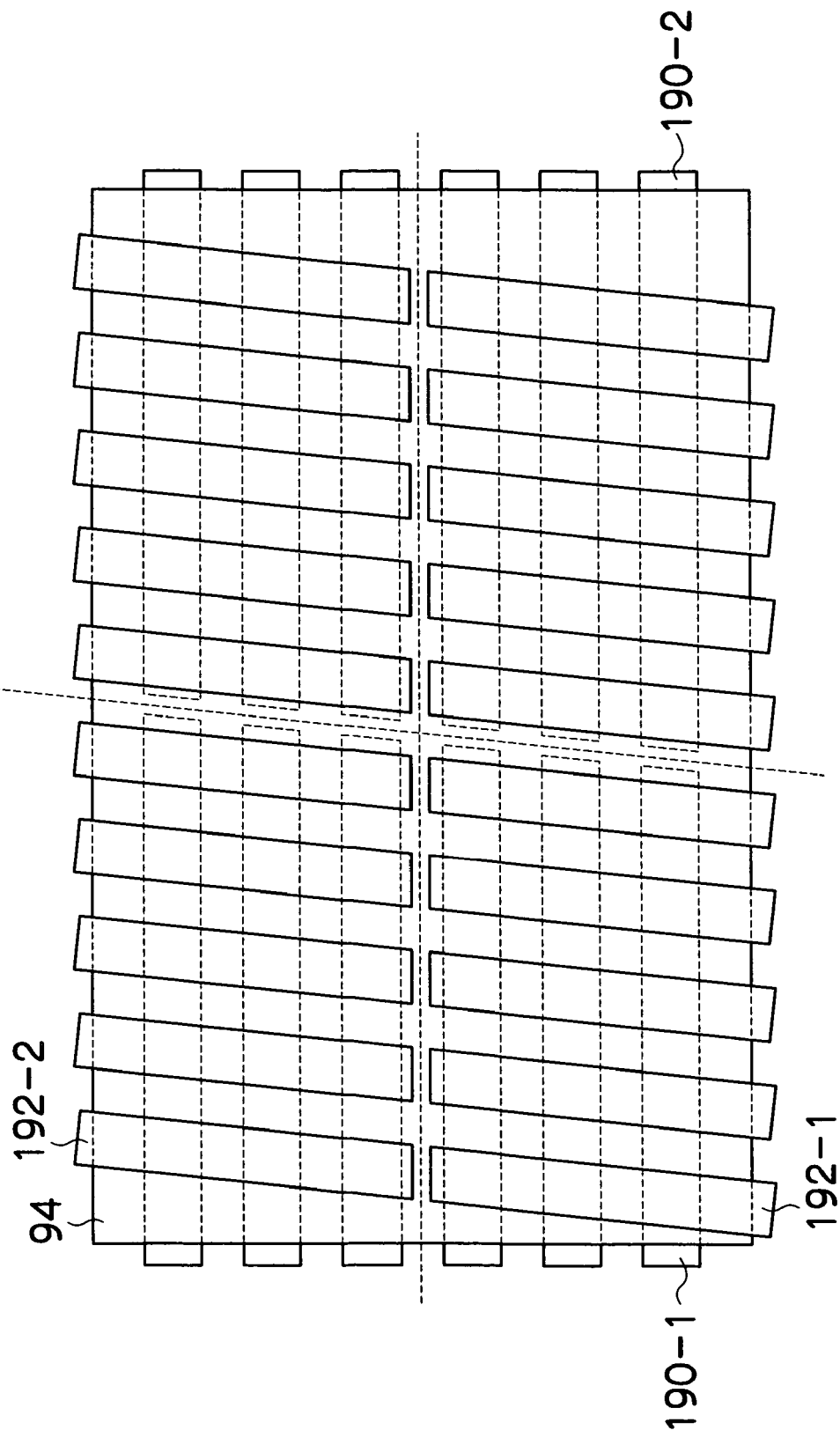

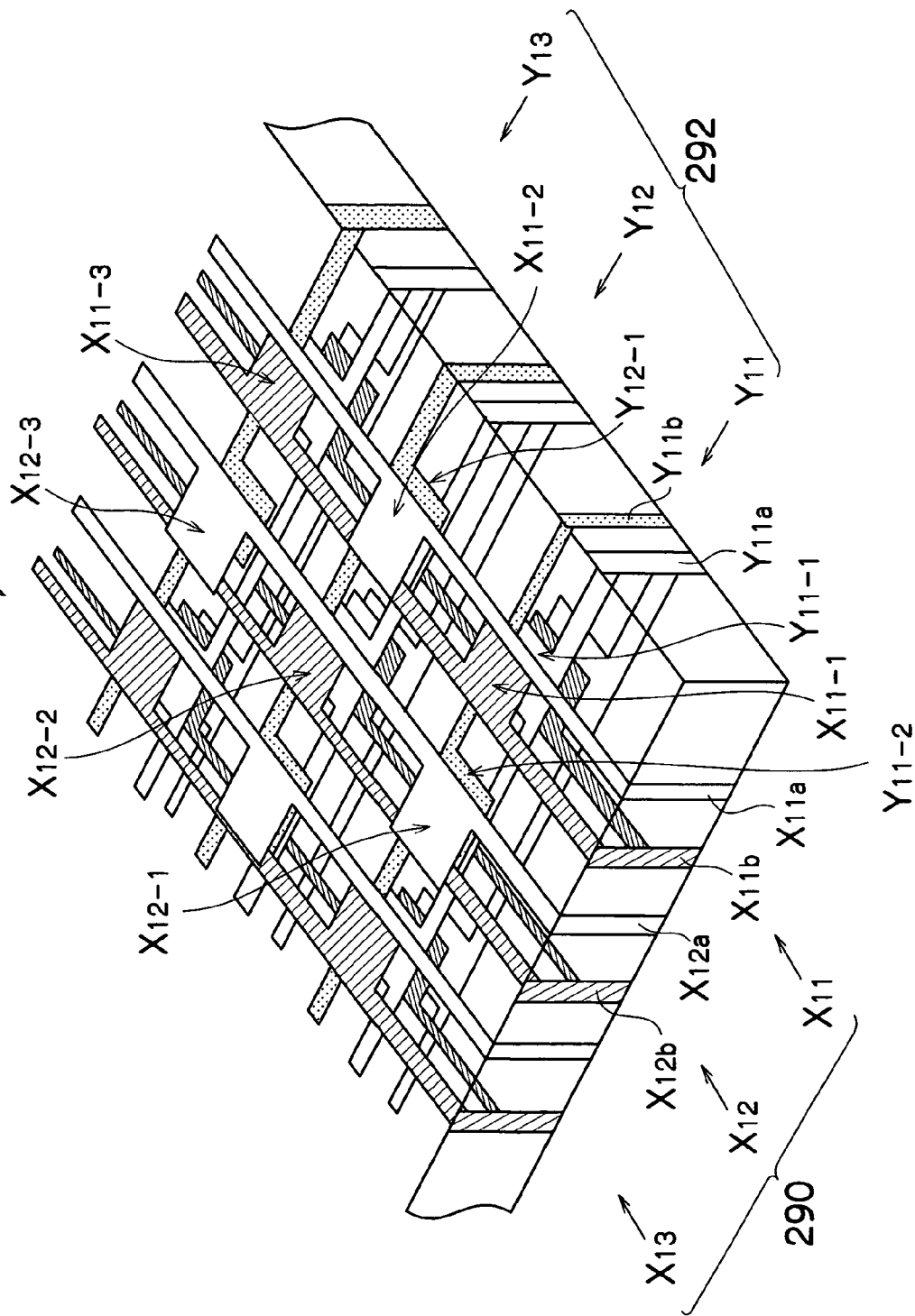

X12→
X11→

X12→
X11→

↑ ↑  ....
Y11 Y12

↑ ↑  ....
Y11 Y12

LAMINATED PIEZOELECTRIC ELEMENT, LIQUID DROPLET EJECTION HEAD USING SAME, AND IMAGE FORMING APPARATUS COMPRISING SAME

BACKGROUND OF THE INVENTION

1. Field of the Invention

The present invention relates to a laminated piezoelectric element, a liquid droplet ejection head using the laminated piezoelectric element, and an image forming apparatus having the liquid droplet ejection head.

2. Description of the Related Art

One conventionally known image forming apparatus which forms images on a recording medium is an inkjet recording apparatus, which forms an image by ejecting ink in the from of liquid droplets from nozzles (liquid droplet ejection ports) toward the recording medium.

It has been sought to form high-resolution, high-quality images, such as photographic prints, with the inkjet recording apparatuses. For this purpose, it is effective to reduce the size of the ink droplets ejected from the nozzles by reducing the nozzle size as well as to arrange the nozzles at higher density.

However, about reducing the nozzle pitch and arranging the nozzles at high density in one row, there are manufacturing restrictions, and the like. If the nozzles are to be arranged at high density without restricting the real nozzle pitch, then it is effective to arrange the nozzles in the form of a matrix (two-dimensional matrix).

On the other hand, in order to eject ink of high viscosity, it is necessary to increase the generated pressure for ejecting the ink. For example, it has been considered that the generated pressure can be increased by layering together a plurality of piezoelectric elements in a piezoelectric system, in which a diaphragm that forms a portion of a pressure chamber is deformed by means of the deformation of a piezoelectric element, thereby changing (reducing) the volume of the pressure chamber, applying a pressure to the ink inside the pressure chamber, and thereby causing the ink to be ejected from a nozzle in the form of a droplet.

For example, Japanese Patent Application Publication No. 8-11304 discloses an inkjet head using a laminated piezoelectric element of this kind, in which a laminated piezoelectric element formed of piezoelectric members and intermediate electrodes of conductive material layered together alternately and burned is cut by slicing to leave a base portion (common seating) without electrodes, thus forming grooves which mechanically separate the individual piezoelectric elements. The laminated electrodes are formed to connect a pair of opposing electrodes through the respective side faces of each of the individual piezoelectric elements, in such a manner that the electrodes can be wired to the uppermost surface.

However, in Japanese Patent Application Publication No. 8-11304, it is necessary to form the electrodes on the side faces of the grooves after forming the laminated piezoelectric elements and then applying grooves to the laminated piezoelectric elements. Therefore, if the grooves are very fine due to high-density arrangement of the nozzles, and/or if a large force is required when it is to eject high-viscosity ink, for instance, then the total number of piezoelectric elements will be very large, the thickness of the piezoelectric elements will also be large, and the grooves will be deep. Consequently, the bottom portion of the grooves becomes obscured, and it becomes difficult or impossible to form electrodes on the side faces of the grooves.

Japanese Patent Application Publication No. 3-261560, for example, discloses a flat surface printer based on a bubble jet system in which the ink is heated, thus generating air bubbles, and ink is ejected by the expansive energy created as these air bubbles grow, the nozzles of the head being arranged in the form of a matrix. In this printer, a plurality of segment lines and common lines are arranged in a matrix fashion, and nozzles, ink flow channels for supplying ink to these nozzles, and heat generating resistances are arranged in the vicinity of the points of intersections between the segment lines and the common lines.

However, Japanese Patent Application Publication No. 3-261560 is limited to the bubble jet type inkjet printer, which is inadequate for ejecting ink of high viscosity. Furthermore, it is hard to form an image of high quality since the tonal gradation of the recorded image is difficult to be controlled.

SUMMARY OF THE INVENTION

The present invention has been contrived in view of the foregoing circumstances, and it is an object of the invention to provide a laminated piezoelectric element, a liquid droplet ejection head using the laminated piezoelectric element, and an image forming apparatus comprising the liquid droplet ejection head, whereby the number of wires can be reduced and a high-density nozzle arrangement can be achieved by enabling electrodes to be wired through the side surfaces of the laminated piezoelectric elements, in such a manner that cross-talk can be prevented, tonal gradation can be controlled, and high-quality image formation can be achieved.

In order to attain the aforementioned object, the present invention is directed to a laminated piezoelectric element, comprising a plurality of layers including first electrodes, piezoelectric material bodies, and second electrodes, wherein: the layers are laminated in order of the first electrode, the piezoelectric material body, the second electrode, and the piezoelectric material body; a plurality of active parts of the laminated piezoelectric element, where the piezoelectric material bodies are capable of actively expanding and contracting when a voltage is applied to the first electrode and the second electrode that are mutually opposing across the piezoelectric material body, are two-dimensionally arranged in a row direction and a column direction; and the first electrodes are common to the plurality of active parts in the row direction and the second electrodes are common to the plurality of active parts in the column direction.

Preferably, the first electrodes and the second electrodes are connected to wiring through end faces of the laminated piezoelectric element.

According to the present invention, the electrode wiring can be connected readily, and high-density arrangement of nozzles can be achieved. In addition to that, the number of control circuits and drivers can be reduced, and handling during head manufacture can be facilitated.

Preferably, at least a portion of inactive parts that are not activated by application of voltage to the first electrode and the second electrode is formed into one of a recessed shape and a perforated shape.

Preferably, electrode pairs formed by the first electrodes and the second electrodes arranged in a two-dimensional arrangement are divided into a plurality of regions that are drivable independently from each other. Preferably, the plurality of regions are obtained by dividing into four regions by means of a line parallel to the row direction and a line parallel to the column direction, the two lines passing through an substantial central portion of the two-dimensional arrangement.

According to the present invention, it is possible to increase the number of active parts that can be simultaneously driven.

Preferably, the first electrodes are common to every other of the active parts and the second electrodes are common to every other of the active parts. Preferably, two of the first electrodes that are arranged adjacently in the row direction are arranged in a staggered fashion and connected so as to be simultaneously driven.

According to the present invention, it is possible to prevent cross-talk and droplets-interference between mutually adjacent active parts.

Preferably, electrode pairs formed by the first electrodes and the second electrodes are not only arranged two-dimensionally in the row direction and the column direction but also superimposed to each other in a lamination direction that is perpendicular to the row direction and the column direction, in such a manner that each of the layers is independently drivable.

According to the present invention, it is possible to control tonal gradation by varying the amount of drive displacement without altering the voltage, and it is also possible to alter the drive timing.

In order to attain the aforementioned object, the present invention is also directed to a liquid droplet ejection head, comprising a drive actuator including the above-described laminated piezoelectric element. According to the present invention, the electrode wiring can be connected readily, high-density arrangement of the nozzles can be achieved, high-viscosity ink can be ejected, and the tonal gradation can be controlled. Moreover, it is possible to prevent cross-talk and droplets-interference.

In order to attain the aforementioned object, the present invention is also directed to an image forming apparatus, comprising the above-described liquid droplet ejection head. According to the present invention, it is possible to form an image of high quality.

As described above, according to the laminated piezoelectric element according to the present invention, the liquid droplet ejection head using the laminated piezoelectric element, and the image forming apparatus comprising the liquid droplet ejection head, the electrode wiring can be connected readily, the nozzles can be arranged at high density, the number of the control circuits and the drivers can be reduced, and the handling during head manufacture is facilitated.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 8 is a plan view showing a first embodiment of a laminated piezoelectric element according to an embodiment of the present invention;

FIG. 11 is a plan view showing a second embodiment of the laminated piezoelectric element according to an embodiment of the present invention;

FIG. 12 is an oblique view showing a third embodiment of the laminated piezoelectric element according to an embodiment of the present invention;

DETAILED DESCRIPTION OF THE PREFERRED EMBODIMENTS

Figure 1:
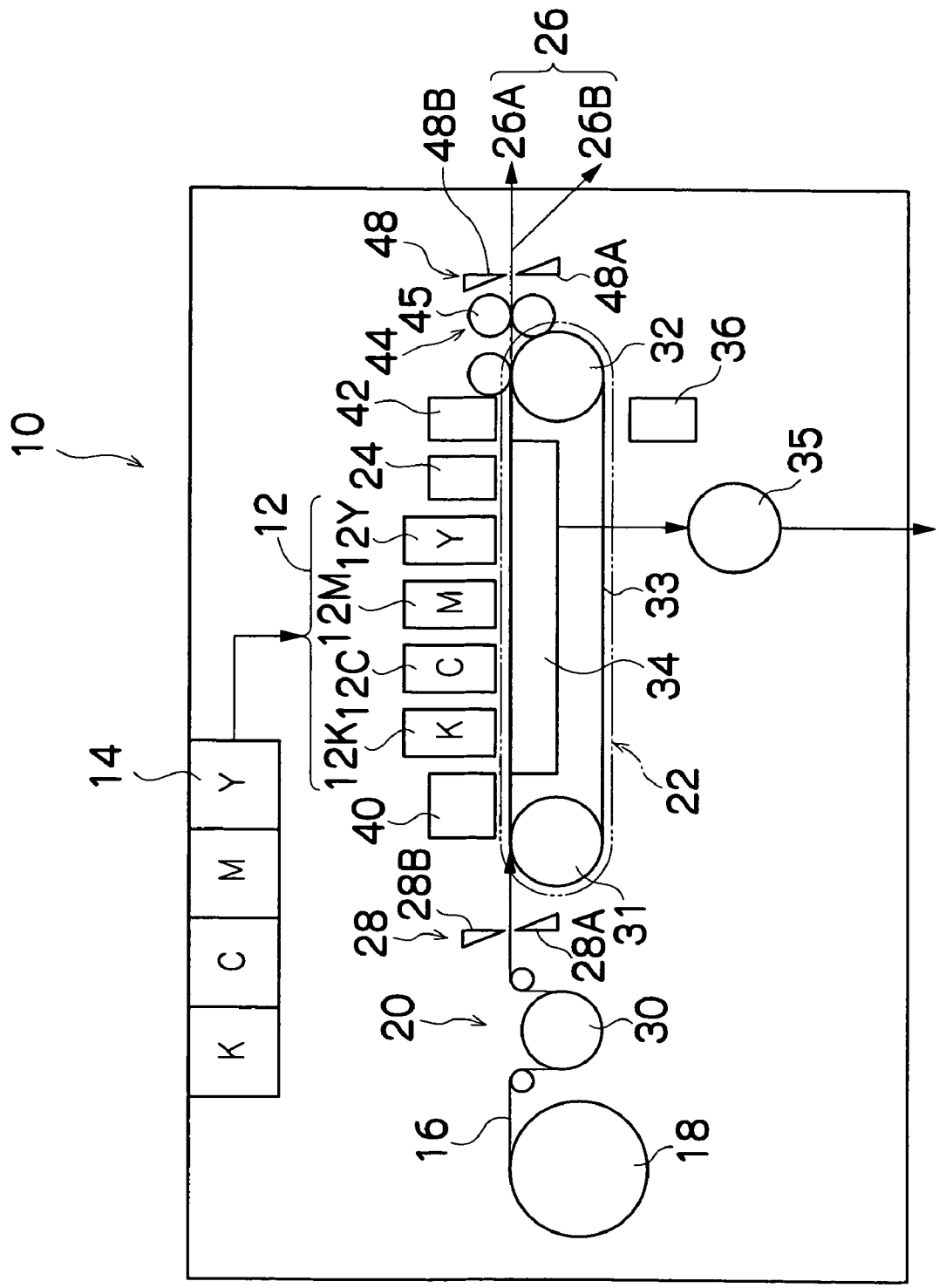
FIG. 1 is a general compositional drawing showing an overview of an embodiment of an inkjet recording apparatus as an image forming apparatus having a liquid droplet ejection head which uses the laminated piezoelectric element according to the present invention.

FIG. 1 is a general compositional drawing showing an overview of one embodiment of an inkjet recording apparatus as an image forming apparatus having a liquid droplet ejection head which uses the laminated piezoelectric element according to the present invention.

As shown in FIG. 1, the inkjet recording apparatus 10 comprises: a printing unit having a plurality of print heads (inkjet recording heads) 12K, 12C, 12M, and 12Y for ink colors of black (K), cyan (C), magenta (M), and yellow (Y), respectively; an ink storing and loading unit 14 for storing inks of black (K), cyan (C), magenta (M), and yellow (Y) to be supplied to the print heads 12K, 12C, 12M, and 12Y; a paper supply unit 18 for supplying recording paper 16; a decurling unit 20 for removing curl in the recording paper 16 supplied from the paper supply unit 18; a suction belt conveyance unit 22 disposed facing the nozzle face (ink-droplet ejection face) of the print unit 12, for conveying the recording paper 16 while keeping the recording paper 16 flat; a print determination unit 24 for reading the printed result produced by the printing unit 12; and a paper output unit 26 for outputting image-printed recording paper (printed matter) to the exterior.

In FIG. 1, a magazine for rolled paper (continuous paper) is shown as an example of the paper supply unit 18; however, more magazines with paper differences such as paper width and quality may be jointly provided. Moreover, papers may be supplied with cassettes that contain cut papers loaded in layers and that are used jointly or in lieu of the magazine for rolled paper.

In the case of a configuration in which roll paper is used, a cutter 28 is provided as shown in FIG. 1, and the roll paper is cut to a desired size by the cutter 28. The cutter 28 has a stationary blade 28A, whose length is not less than the width of the conveyor pathway of the recording paper 16, and a round blade 28B, which moves along the stationary blade 28A. The stationary blade 28A is disposed on the reverse side of the printed surface of the recording paper 16, and the round blade 28B is disposed on the printed surface side across the conveyance path. When cut paper is used, the cutter 28 is not required.

In the case of a configuration in which a plurality of types of recording paper can be used, it is preferable that an information recording medium, such as a bar code and a wireless tag, containing information about the type of paper is attached to the magazine, the type of paper to be used is automatically determined by reading the information contained in the information recording medium with a specific reading device, and ink-droplet ejection is controlled so that the ink-droplets are ejected in an appropriate manner in accordance with the type of paper.

The recording paper 16 delivered from the paper supply unit 18 retains curl due to having been loaded in the magazine. In order to remove the curl, heat is applied to the recording paper 16 in the decurling unit 20 by a heating drum 30 in the direction opposite from the curl direction in the magazine. The heating temperature at this time is preferably controlled so that the recording paper 16 has a curl in which the surface on which the print is to be made is slightly round outward.

The decurled and cut recording paper 16 is delivered to the suction belt conveyance unit 22. The suction belt conveyance unit 22 has a configuration in which an endless belt 33 is set around rollers 31 and 32 so that the portion of the endless belt 33 facing at least the nozzle face of the printing unit 12 and the sensor face of the print determination unit 24 forms a horizontal plane (flat plane).

The belt 33 has a width that is greater than the width of the recording paper 16, and a plurality of suction apertures (not shown) are formed on the belt surface. A suction chamber 34 is disposed in a position facing the sensor surface of the print determination unit 24 and the nozzle surface of the printing unit 12 on the interior side of the belt 33, which is set around the rollers 31 and 32, as shown in FIG. 1. The suction chamber 34 provides suction with a fan 35 to generate a negative pressure, and the recording paper 16 is held on the belt 33 by suction.

The belt 33 is driven in the clockwise direction in FIG. 1 by the motive force of a motor (not shown) being transmitted to at least one of the rollers 31 and 32, which the belt 33 is set around, and the recording paper 16 held on the belt 33 is conveyed from left to right in FIG. 1.

Since ink adheres to the belt 33 when a marginless print job or the like is performed, a belt-cleaning unit 36 is disposed in a predetermined position (a suitable position outside the printing area) on the exterior side of the belt 33. Although the details of the configuration of the belt-cleaning unit 36 are not shown, examples thereof include a configuration in which the belt 33 is nipped with cleaning rollers such as a brush roller and a water absorbent roller, an air blow configuration in which clean air is blown onto the belt 33, or a combination of these. In the case of the configuration in which the belt 33 is nipped with the cleaning rollers, it is preferable to make the line velocity of the cleaning rollers different than that of the belt 33 to improve the cleaning effect.

The inkjet recording apparatus 10 can comprise a roller nip conveyance mechanism, in which the recording paper 16 is pinched and conveyed with nip rollers, instead of the suction belt conveyance unit 22. However, there is a drawback in the roller nip conveyance mechanism that the print tends to be smeared when the printing area is conveyed by the roller nip action because the nip roller makes contact with the printed surface of the paper immediately after printing. Therefore, the suction belt conveyance in which nothing comes into contact with the image surface in the printing area is preferable.

A heating fan 40 is disposed on the upstream side of the printing unit 12 in the conveyance pathway formed by the suction belt conveyance unit 22. The heating fan 40 blows heated air onto the recording paper 16 to heat the recording paper 16 immediately before printing so that the ink deposited on the recording paper 16 dries more easily.

Figure 2:
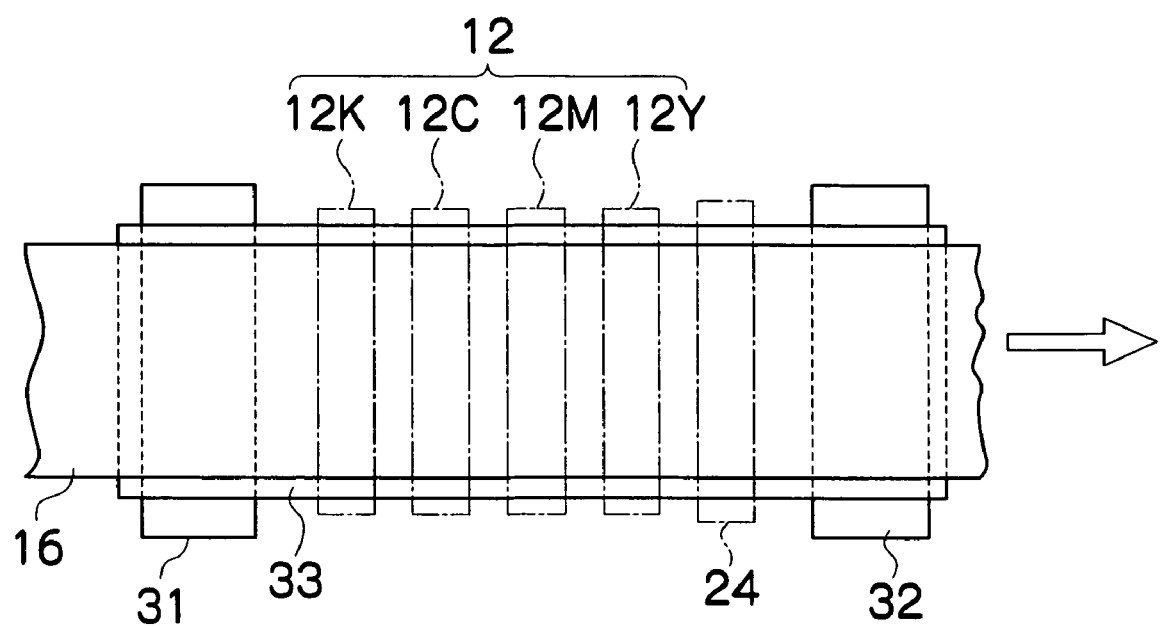
FIG. 2 is a plan view of the principal part of the peripheral area of a print unit in the inkjet recording apparatus shown in FIG. 1.

The print unit 12 is a so-called "full line head" in which a line head having a length corresponding to the maximum width of paper is arranged in a direction (main scanning direction) perpendicular to the paper conveyance direction (sub-scanning direction) (see FIG. 2). As shown in FIG. 2, each of the print heads 12K, 12C, 12M and 12Y is constituted by a line head in which a plurality of ink ejection ports (nozzles) are arranged along a length exceeding at least one side of the maximum size recording paper 16 that can be used with the inkjet recording apparatus 10.

The print heads 12K, 12C, 12M, 12Y corresponding to respective ink colors are disposed in the order, black (K), cyan (C), magenta (M) and yellow (Y), from the upstream side (left-hand side in FIG. 1) in the feed direction of the recording paper 16 (the paper conveyance direction). A color print can be formed on the recording paper 16 by ejecting the inks from the print heads 12K, 12C, 12M, and 12Y, respectively, onto the recording paper 16 while conveying the recording paper 16.

The print unit 12, in which the full-line heads covering the entire width of the paper are thus provided for the respective ink colors, can record an image over the entire surface of the recording paper 16 by performing the action of moving the recording paper 16 and the print unit 12 relatively to each other in the paper conveyance direction (sub-scanning direction) just once (in other words, by means of a single sub-scan). Higher-speed printing is thereby made possible and productivity can be improved in comparison with a shuttle type head in which a recording head moves reciprocally in the direction (main scanning direction) perpendicular to the paper conveyance direction (sub-scanning direction).

The terms main scanning direction and sub-scanning direction are used in the following senses. In a full-line head comprising a row of nozzles that have a length corresponding to the entire width of the recording paper, the "main scanning" is defined as printing one line (a line formed of a row of dots, or a line formed of a plurality of rows of dots) in the breadthways direction of the recording paper (the direction perpendicular to the conveyance direction of the recording paper) by driving the nozzles in one of the following ways: (1) simultaneously driving all the nozzles; (2) driving the nozzles sequentially from one side toward the other side; and (3) dividing the nozzles into blocks and driving the blocks of the nozzles sequentially from one side toward the other side. The direction indicated by one line recorded by a main scanning action (the lengthwise direction of the band-shaped region thus recorded) is called the "main scanning direction".

On the other hand, "sub-scanning" is defined as to repeatedly perform printing of one line (a line formed of a row of dots, or a line formed of a plurality of rows of dots) formed by the main scanning, while moving the full-line head and the recording paper relatively to each other. The direction in which sub-scanning is performed is called the sub-scanning direction. Consequently, the conveyance direction of the recording paper is the sub-scanning direction and the direction perpendicular to the sub-scanning direction is called the main scanning direction.

Although the configuration with the KCMY four standard colors is described in the present embodiment, combinations of the ink colors and the number of colors are not limited to those. Light and/or dark inks can be added as required. For example, a configuration is possible in which inkjet heads for ejecting light-colored inks such as light cyan and light magenta are added. Furthermore, there are no particular restrictions of the sequence in which the print heads of respective colors are arranged.

As shown in FIG. 1, the ink storing and loading unit 14 has tanks for storing inks of the colors corresponding to the respective print heads 12K, 12C, 12M and 12Y, and each tank is connected to a respective print head 12K, 12C, 12M, 12Y, via a tube channel (not shown). Moreover, the ink storing and loading unit 14 also comprises notifying means (display means, alarm generating means, or the like) for generating a notification if the remaining amount of ink has become low. Furthermore, the ink storing and loading unit 14 also comprises a mechanism for preventing incorrect loading of the wrong colored ink.

The print determination unit 24 has an image sensor (line sensor or the like) for capturing an image of the ink-droplet deposition result of the printing unit 12, and functions as a device to check for ejection defects such as clogs of the nozzles in the printing unit 12 from the ink-droplet deposition results evaluated by the image sensor.

The print determination unit 24 of the present embodiment is configured with at least a line sensor having rows of photoelectric conversion elements with a width that is greater than the ink-droplet ejection width (image recording width) of the print heads 12K, 12C, 12M, and 12Y. This line sensor has a color separation line CCD sensor including a red (R) sensor row composed of photoelectric conversion elements (pixels) arranged in a line provided with an R filter, a green (G) sensor row with a G filter, and a blue (B) sensor row with a B filter. Instead of a line sensor, it is possible to use an area sensor composed of photoelectric conversion elements which are arranged two-dimensionally.

The print determination unit 24 reads a test pattern image printed by the print heads 12K, 12C, 12M, and 12Y for the respective colors, and the ejection from each head is determined. The ejection determination includes the presence of the ejection, measurement of the dot size, and measurement of the dot deposition position.

A post-drying unit 42 is disposed following the print determination unit 24. The post-drying unit 42 is a device to dry the printed image surface, and includes a heating fan, for example. It is preferable to avoid contact with the printed surface until the printed ink dries, and a device that blows heated air onto the printed surface is preferable.

In cases in which printing is performed with dye-based ink on porous paper, blocking the pores of the paper by the application of pressure prevents the ink from coming contact with ozone and other substance that cause dye molecules to break down, and has the effect of increasing the durability of the print.

A heating/pressurizing unit 44 is disposed following the post-drying unit 42. The heating/pressurizing unit 44 is a device to control the glossiness of the image surface, and the image surface is pressed with a pressure roller 45 having a predetermined uneven surface shape while the image surface is heated, and the uneven shape is transferred to the image surface.

The printed matter generated in this manner is outputted from the paper output unit 26. The target print (i.e., the result of printing the target image) and the test print are preferably outputted separately. In the inkjet recording apparatus 10, a sorting device (not shown) is provided for switching the outputting pathways in order to sort the printed matter with the target print and the printed matter with the test print, and to send them to paper output units 26A and 26B, respectively. When the target print and the test print are simultaneously formed in parallel on the same large sheet of paper, the test print portion is cut and separated by a cutter (second cutter) 48. The cutter 48 is disposed directly in front of the paper output unit 26, and is used for cutting the test print portion from the target print portion when a test print has been performed in the blank portion of the target print. The structure of the cutter 48 is the same as the first cutter 28 described above, and has a stationary blade 48A and a round blade 48B.

Although not shown in the drawings, the paper output unit 26A for the target prints is provided with a sorter for collecting prints according to print orders.

Figure 3:
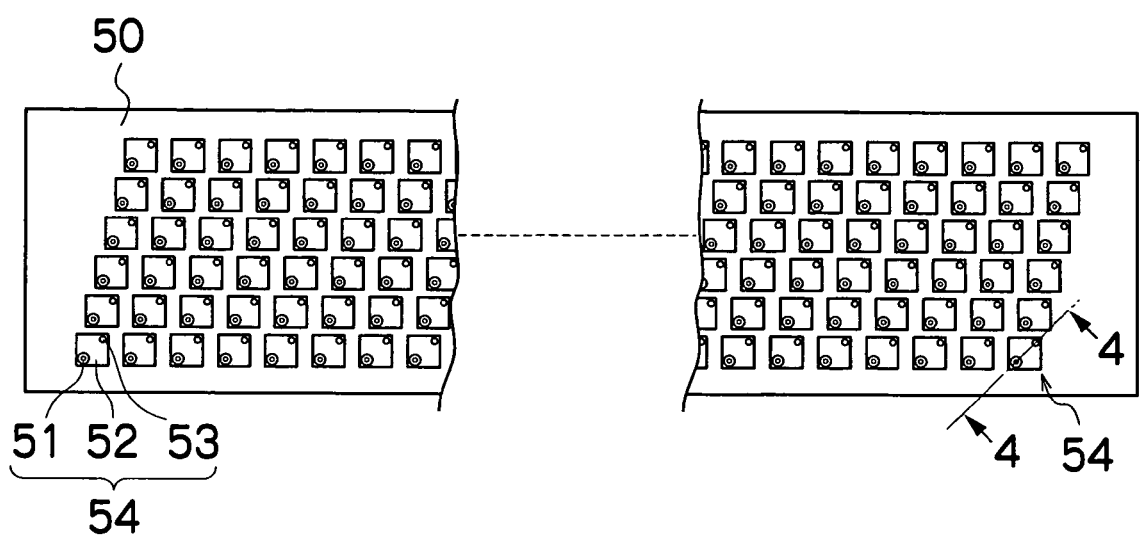
FIG. 3 is a plan perspective view showing an example of the structure of a print head.

Next, the structure of a print head (liquid droplet ejection head) will be described. The print heads 12K, 12C, 12M and 12Y provided for the respective ink colors have the same structure, and a reference numeral 50 is hereinafter designated to any of the heads. FIG. 3 shows a plan perspective view of the print head 50.

As shown in FIG. 3, the print head 50 according to the present embodiment achieves a high density arrangement of nozzles 51 by using a two-dimensional staggered matrix array of pressure chamber units 54. Each of the pressure chamber units 54 comprises a nozzle 51 for ejecting ink as ink droplets, a pressure chamber 52 for applying pressure to the ink in order to eject ink, and an ink supply port 53 for supplying ink to the pressure chamber 52 from a common flow channel (not shown).

As shown in FIG. 3, each pressure chamber 52 has a substantially square shape when viewed from above, and a nozzle 51 is formed at one end of a diagonal of the square, while an ink supply port 53 is provided at the other end thereof.

Figure 4:
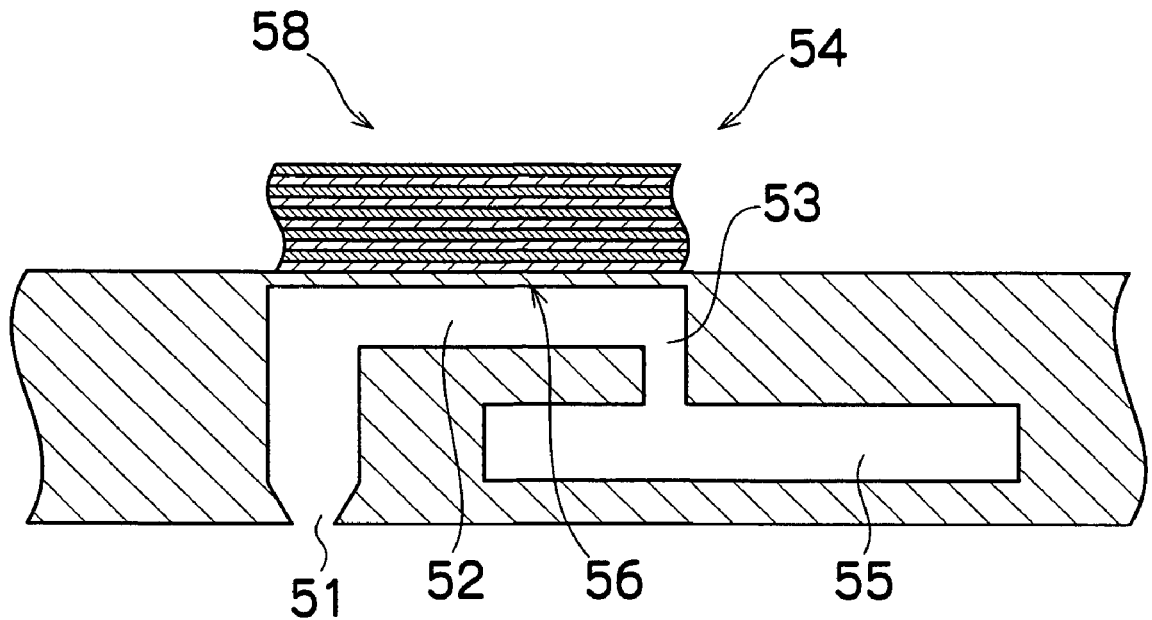
FIG. 4 is a cross-sectional view along line 4-4 in FIG. 3, showing an example of the structure of a pressure chamber.

Furthermore, FIG. 4 shows a cross-sectional view along line 4-4 in FIG. 3.

As shown in FIG. 4, each pressure chamber unit 54 is formed by a pressure chamber 52 which is connected to the nozzle 51 that can eject ink, a common flow channel 55 for supplying ink via a supply port 53 is connected to the pressure chamber 52, and one surface of the pressure chamber 52 (the ceiling-surface in FIG. 4) is formed by a diaphragm 56. A laminated piezoelectric element 58 which deforms the diaphragm 56 by applying pressure to the diaphragm 56 is bonded to the upper part of the diaphragm.

As will hereinafter be described in detail, the laminated piezoelectric element 58 includes electrode layers and piezoelectric element layers that are layered alternately. Each of the laminated piezoelectric elements 58 comprises a piezoelectric element which is layered between two electrodes (a common electrode and an individual electrode (described in more detail below)), and the piezoelectric element (and consequently, the whole of the laminated piezoelectric element 58) is deformed by applying a drive voltage between these electrodes, thereby pushing the diaphragm 56, reducing the volume of the pressure chamber 52, and causing ink to be ejected from the nozzle 51. When the laminated piezoelectric element 58 returns to its original position, the volume of the pressure chamber 52 returns to its original size, and new ink is supplied into the pressure chamber 52 from the common supply channel 55 and via the supply port 53.

Figure 5:
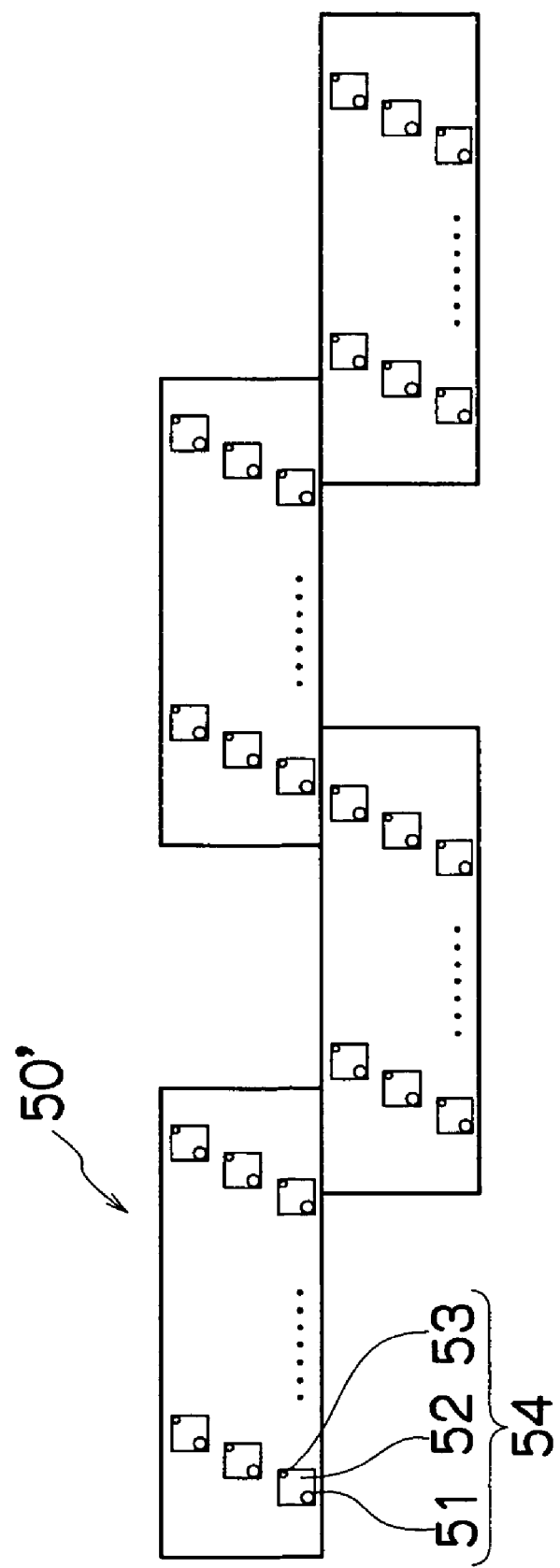
FIG. 5 is a plan view showing a further example of a print head.

FIG. 5 is a perspective plan view showing another example of the structure of a print head. As shown in FIG. 5, one long full line head may be constituted by combining a plurality of short heads 50' arranged in a two-dimensional staggered array, in such a manner that the combined length of this plurality of short heads 50' corresponds to the full width of the print medium.

Figure 6:
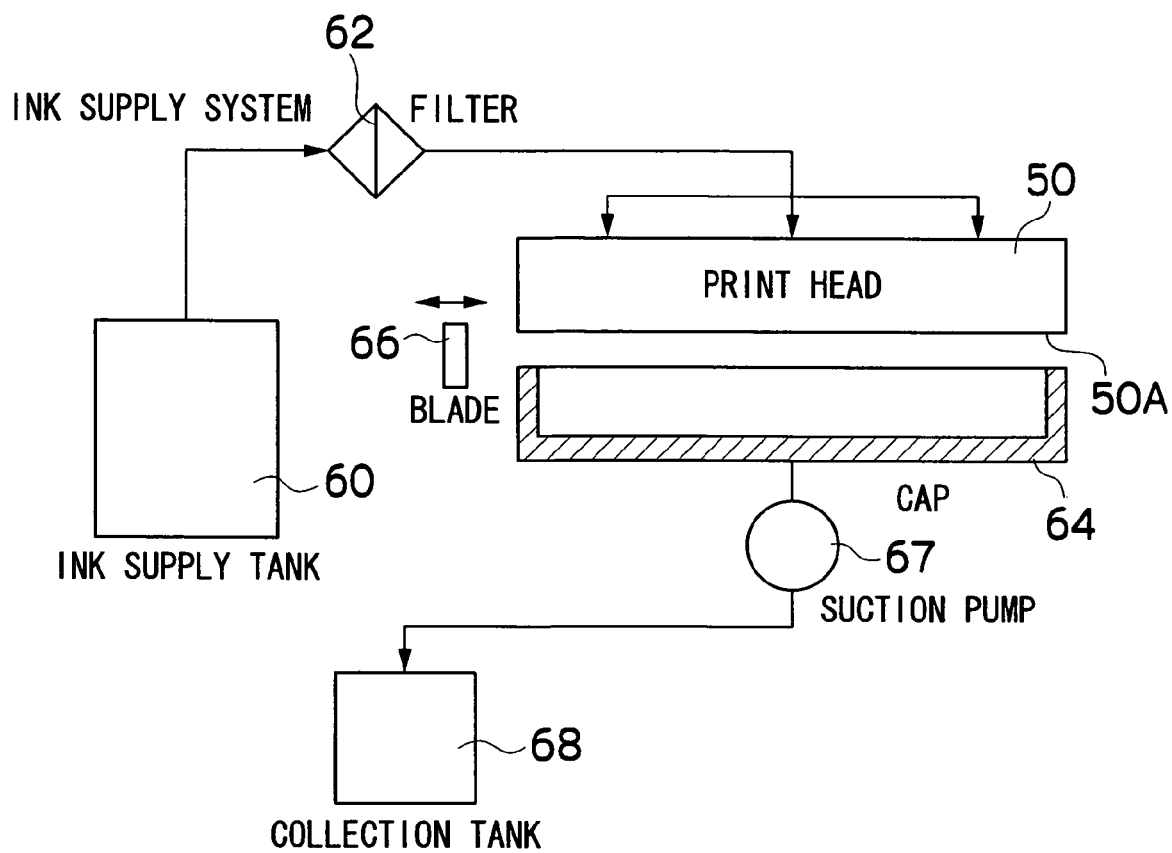
FIG. 6 is a schematic drawing showing the composition of an ink supply system in the inkjet recording apparatus.

FIG. 6 is a schematic drawing showing the configuration of the ink supply system in the inkjet recording apparatus 10. The ink tank 60 is a base tank that supplies ink to the print head 50 and is set in the ink storing and loading unit 14 described with reference to FIG. 1. The aspects of the ink tank 60 include a refillable type and a cartridge type: when the remaining amount of ink is low, the ink tank 60 of the refillable type is filled with ink through a filling port (not shown) and the ink tank 60 of the cartridge type is replaced with a new one. In order to change the ink type in accordance with the intended application, the cartridge type is suitable, and it is preferable to represent the ink type information with a bar code or the like on the cartridge, and to perform ejection control in accordance with the ink type. The ink tank 60 in FIG. 6 is equivalent to the ink storing and loading unit 14 in FIG. 1 described above.

As shown in FIG. 6, a filter 62 for eliminating foreign material and air bubbles is provided at an intermediate position of the tubing which connects the ink tank 60 with the print head 50. Desirably, the filter mesh size is the same as the nozzle diameter in the print head 50, or smaller than the nozzle diameter (generally, about 20 μm).

Although not shown in FIG. 6, it is preferable to provide a sub-tank integrally to the print head 50 or nearby the print head 50. The sub-tank has a damper function for preventing variation in the internal pressure of the head and a function for improving refilling of the print head.

The inkjet recording apparatus 10 is also provided with a cap 64 as a device to prevent the nozzles from drying out or to prevent an increase in the ink viscosity in the vicinity of the nozzles, and a cleaning blade 66 as a device to clean the nozzle face 50A.

A maintenance unit including the cap 64 and the cleaning blade 66 can be relatively moved with respect to the print head 50 by a movement mechanism (not shown), and is moved from a predetermined holding position to a maintenance position below the print head 50 as required.

The cap 64 is displaced upwards and downwards relatively with respect to the print head 50 by an elevator mechanism (not shown). When the power of the inkjet recording apparatus 10 is switched OFF or when in a print standby state, the elevator mechanism raises the cap 64 to a predetermined elevated position so as to come into close contact with the print head 50, and the nozzle region of the nozzle face 50A is thereby covered by the cap 64.

The cleaning blade 66 is composed of rubber or another elastic member, and can slide on the ink discharge surface (nozzle surface 50A) of the print head 50 by means of a blade movement mechanism (not shown). If there are ink droplets or foreign matter adhering to the nozzle surface 50A, then the nozzle surface 50A is wiped by causing the cleaning blade 66 to slide over the nozzle surface 50A, thereby cleaning the nozzle surface 50A.

During printing or during standby, if the use frequency of a particular nozzle 51 has declined and the ink viscosity in the vicinity of the nozzle 51 has increased, then a preliminary ejection is performed toward the cap 64, in order to remove the ink that has degraded as a result of increasing in viscosity.

Also, when bubbles have become intermixed in the ink inside the print head 50 (inside the pressure chamber 52), the cap 64 is placed on the print head 50, the ink inside the pressure chamber 52 (the ink in which bubbles have become intermixed) is removed by suction with a suction pump 67, and the suction-removed ink is sent to a collection tank 68. This suction action entails the suctioning of degraded ink whose viscosity has increased (hardened) also when initially loaded into the head, or when service has started after a long period of being stopped.

In other words, when a state in which ink is not ejected from the print head 50 continues for a certain amount of time or longer, the ink solvent in the vicinity of the nozzles 51 evaporates and the ink viscosity increases. In such a state, ink can no longer be ejected from the nozzles 51 even if the actuators (laminated piezoelectric elements 58) for ejection driving are operated. Therefore, the laminated piezoelectric element 58 is operated toward an ink receptacle, before reaching such a state (while the ink viscosity is within a range that allows ejection by the operation of the laminated piezoelectric elements 58), and a "preliminary ejection" is performed which causes the ink in the vicinity of the nozzles whose viscosity has increased to be ejected. Furthermore, after cleaning away soiling on the surface of the nozzle surface 50A by means of a wiper, such as a cleaning blade 66, provided as a cleaning device on the nozzle surface 50A, a preliminary ejection is also carried out in order to prevent infiltration of foreign substances inside the nozzles 51 due to the rubbing action of the wiper. The preliminary ejection is also referred to as "dummy ejection", "purge", "liquid ejection", and so on.

When bubbles have become intermixed in the nozzle 51 or the pressure chamber 52, or when the ink viscosity inside the nozzle 51 has increased over a certain level, ink can no longer be ejected by the preliminary discharge, and a suctioning action is carried out as follows.

More specifically, when bubbles have become intermixed in the ink inside the nozzle 51 and the pressure chamber 52, or when the ink viscosity in the nozzle 51 increases to a certain level or more, ink can no longer be ejected from the nozzles 51 even if the laminated piezoelectric element 58 is operated. In a case of this kind, a cap 64 is placed on the nozzle surface 50A of the print head 50, and the ink containing air bubbles or the ink of increased viscosity inside the pressure chambers 52 is suctioned by a pump 67.

This suction action is performed with respect to all the ink in the pressure chamber 52, and therefore the amount of ink consumption is considerable. Consequently, it is desirable that a preliminary ejection is carried out, whenever possible, while the increase in viscosity is still minor. The cap 64 described in FIG. 6 functions as a suctioning device and it may also function as an ink receptacle for the preliminary ejection.

Moreover, desirably, the inside of the cap 64 is divided by means of partitions into a plurality of areas corresponding to the nozzle rows, thereby achieving a composition in which suction can be performed selectively in each of the demarcated areas, by means of a selector, or the like.

Figure 7:
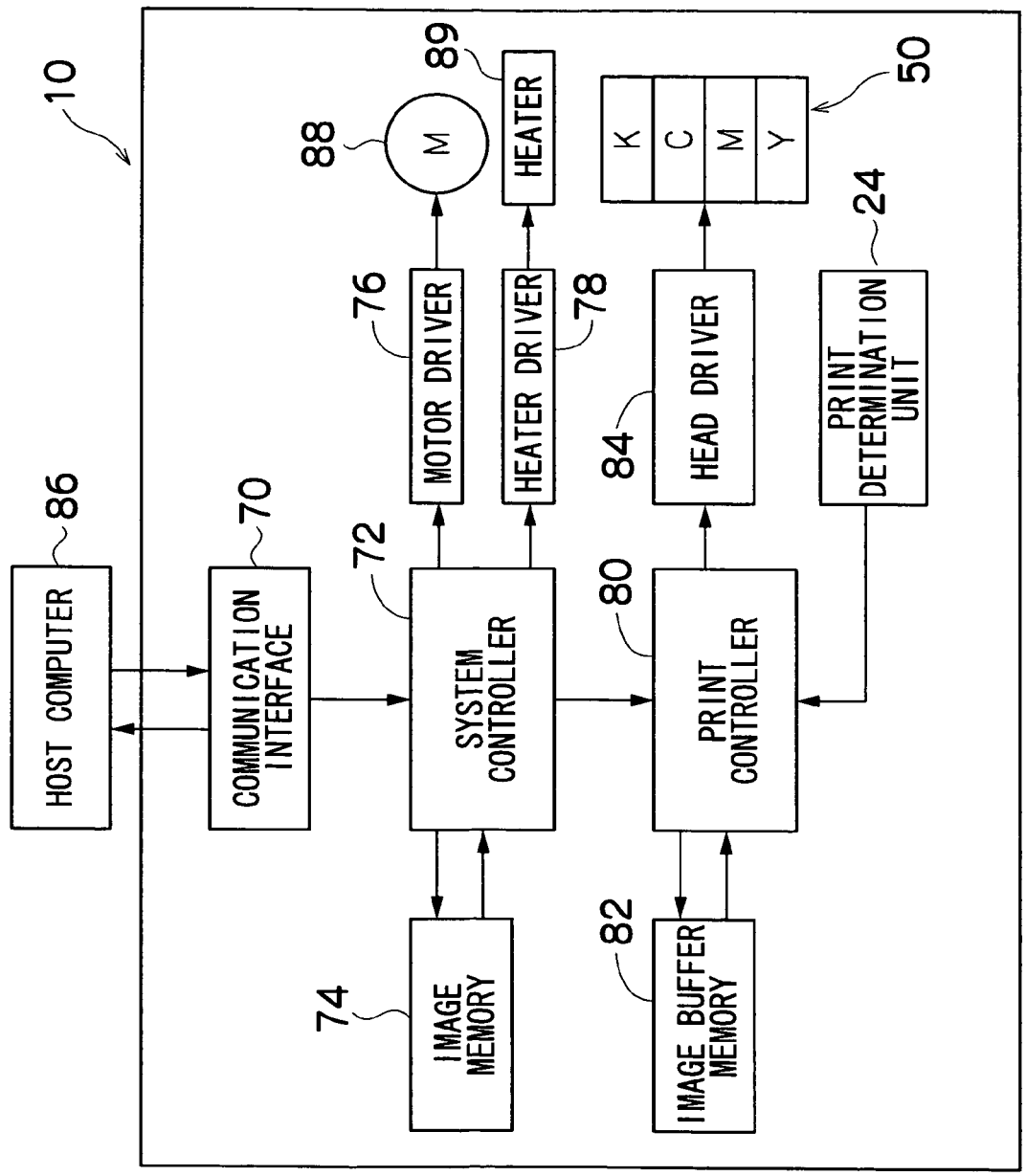
FIG. 7 is a principal block diagram showing the system composition of the inkjet recording apparatus.

FIG. 7 is a principal block diagram showing the system configuration of the inkjet recording apparatus 10. The inkjet recording apparatus 10 comprises a communication interface 70, a system controller 72, an image memory 74, a motor driver 76, a heater driver 78, a print controller 80, an image buffer memory 82, a head driver 84, and the like.

The communication interface 70 is an interface unit for receiving image data sent from a host computer 86. A serial interface such as USB, IEEE1394, Ethernet, wireless network, or a parallel interface such as a Centronics interface may be used as the communication interface 70. A buffer memory (not shown) may be mounted in this portion in order to increase the communication speed. The image data sent from the host computer 86 is received by the inkjet recording apparatus 10 through the communication interface 70, and is temporarily stored in the image memory 74. The image memory 74 is a storage device for temporarily storing images inputted through the communication interface 70, and data is written and read to and from the image memory 74 through the system controller 72. The image memory 74 is not limited to a memory composed of semiconductor elements, and a hard disk drive or another magnetic medium may be used.

The system controller 72 is a control unit for controlling the various sections, such as the communications interface 70, the image memory 74, the motor driver 76, the heater driver 78, and the like. The system controller 72 comprises a central processing unit (CPU) and peripheral circuits thereof, and the like. In addition to controlling communications with the host computer 86 and controlling reading and writing from and to the image memory 74, or the like, the system controller 72 also generates a control signal for controlling the motor 88 of the conveyance system and the heater 89.

The motor driver (drive circuit) 76 drives the motor 88 in accordance with commands from the system controller 72. The heater driver (drive circuit) 78 drives the heater 89 of the post-drying unit 42 or the like in accordance with commands from the system controller 72.

The print controller 80 has a signal processing function for performing various tasks, compensations, and other types of processing for generating print control signals from the image data stored in the image memory 74 in accordance with commands from the system controller 72 so as to supply the generated print control signal (print data) to the head driver 84. Prescribed signal processing is carried out in the print controller 80, and the ejection amount and the ejection timing of the ink droplets from the respective print heads 50 are controlled via the head driver 84, on the basis of the print data. By this means, prescribed dot size and dot positions can be achieved.

The print controller 80 is provided with the image buffer memory 82; and image data, parameters, and other data are temporarily stored in the image buffer memory 82 when image data is processed in the print controller 80. The aspect shown in FIG. 7 is one in which the image buffer memory 82 accompanies the print controller 80; however, the image memory 74 may also serve as the image buffer memory 82. Also possible is an aspect in which the print controller 80 and the system controller 72 are integrated to form a single processor.

The head driver 84 drives the actuators 58 of the print heads 50 of the respective colors on the basis of print data supplied by the print controller 80. The head driver 84 can be provided with a feedback control system for maintaining constant drive conditions for the print heads.

The print determination unit 24 is a block that includes the line sensor (not shown) as described above with reference to FIG. 1, reads the image printed on the recording paper 16, determines the print conditions (presence of the ejection, variation in the dot formation, and the like) by performing desired signal processing, or the like, and provides the determination results of the print conditions to the print controller 80.

According to requirements, the print controller 80 makes various corrections with respect to the print head 50 on the basis of information obtained from the print determination unit 24.

Below, the composition of the laminated piezoelectric element according to an embodiment of the present invention will be described.

FIG. 8 is a plan view showing a first embodiment of the laminated piezoelectric element according to the present invention. As shown in FIG. 8, the laminated piezoelectric element 58 according to the present embodiment is formed by combining a plurality of band-shaped row electrodes (first electrodes) 90 (row X, . . . , row Xm) and a plurality of band-shaped column electrodes (second electrodes) 92 (column Y1, . . . , column Yn) in a lattice configuration. The thin film-shaped piezoelectric body 94 is sandwiched between the plurality of band-shaped row electrodes (first electrodes) 90 (row X1, . . . , row Xm) and the plurality of band-shaped column electrodes (second electrodes) 92 (column Y1, . . . , column Yn).

Here, the "lattice configuration" is not necessarily a lattice in which the row electrodes 90 and the column electrodes 92 are orthogonal, and it may also indicate a state where the column electrodes 92 are arranged so as to intersect obliquely with the row electrodes 90 at an angle slightly less than 90°, as shown in FIG. 8.

As shown in FIG. 3, the intersection points 96 of the respective row electrodes 90 and the respective column electrodes 92 correspond to the positions of the pressure chambers 52 arranged in a staggered two-dimensional matrix in the print head 50. When a voltage is applied to both the row electrode 90 and the column electrode 92 passing through an intersection point 96, then the portion of the piezoelectric body 94 sandwiched between the row electrode 90 and the column electrode 92 is deformed and the ink inside the pressure chamber 52 is ejected from the nozzle 51 communicating with that pressure chamber 52. In this manner, the portion of the intersection point 96 between the row electrode 90 and the column electrode 92 forms an active part which drives in ejecting the ink.

In this case, the row electrode 90 and the column electrode 92 between which the piezoelectric body 94 is sandwiched on the intersection point 96 form an electrode pair for activating the active part. As shown in FIG. 8, each of the row electrodes 90 (row X1, . . . , row Xm) is common to the plurality of active parts in the row direction, and at the same time, each of the column electrodes 92 (column Y1, . . . , column Yn) is common to the plurality of active parts in the column direction.

Figure 9A:
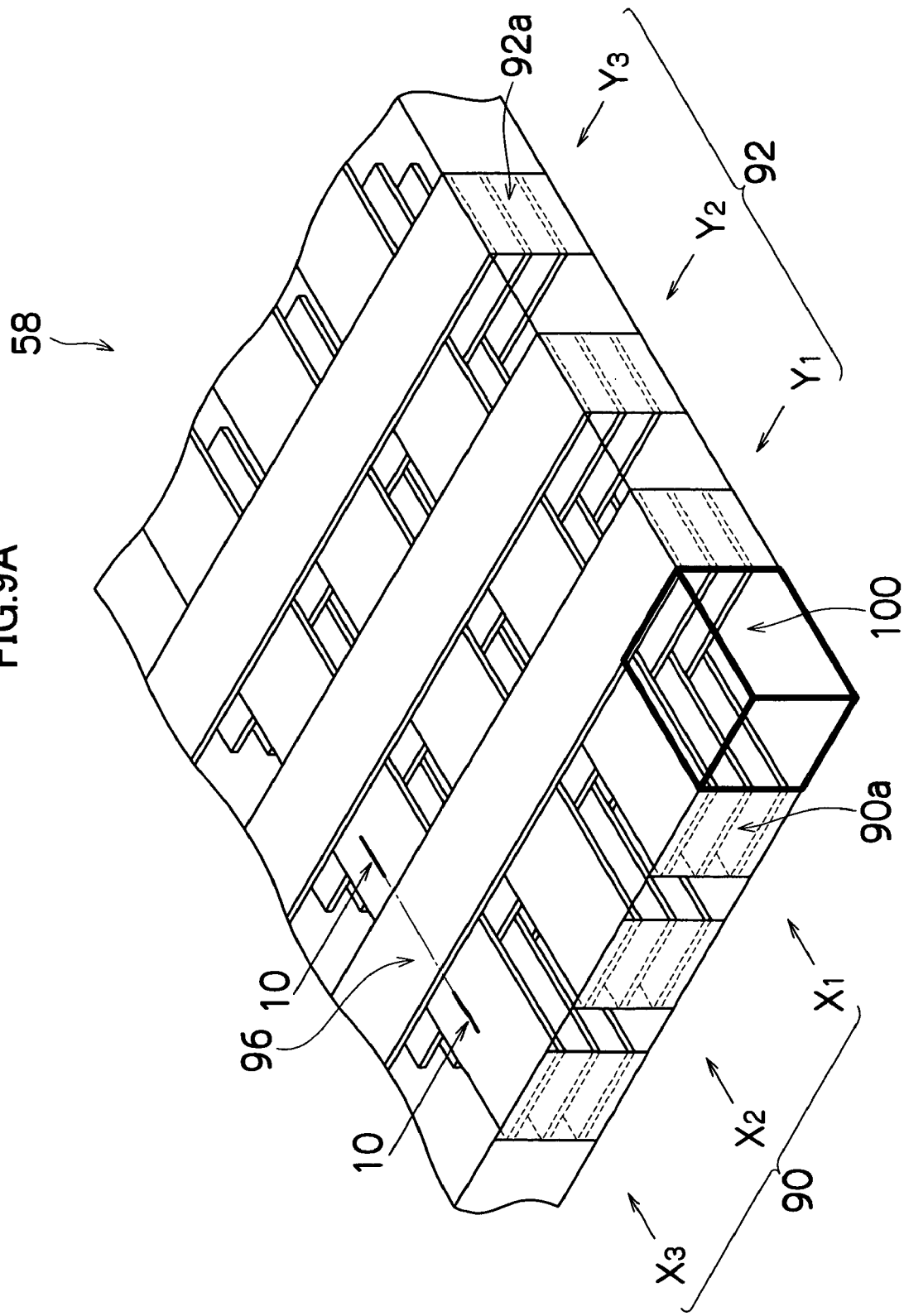
FIG. 9A is an oblique perspective view showing a partial enlarged view of the laminated piezoelectric element in FIG. 8, and FIGS. 9B and 9C are oblique perspective views showing a case where an unnecessary portion of the laminated piezoelectric bodies in FIG. 9A is removed.

FIG. 9A is an oblique perspective view showing a partial enlarged view of the laminated piezoelectric element 58 in FIG. 8. FIG. 9A shows a portion of the row electrodes 90 (X1, X2, X3) and the column electrodes 92 (Y1, Y2, Y3) shown at the bottom left-hand part of FIG. 8. As shown in FIG. 9A, a plurality of row electrodes 90 and column electrodes 92 are layered respectively (in three layers in the embodiment shown in FIG. 9A). Furthermore, although omitted from FIG. 9A, thin-film piezoelectric bodies 94 (see FIG. 8 or FIG. 10) forming the active part are sandwiched respectively between the electrode pairs formed by the row electrodes 90 and the column electrodes 92.

Moreover, as shown in FIG. 9A, the row electrodes 90 (X1, X2, X3) layered in a plurality of layers are electrically connected to each other at an end section 90a formed at the side face of the laminated piezoelectric element 58, in such a manner that wiring can be connected to the row electrodes 90 through this end section 90a (from the side face of the laminated piezoelectric element 58). Furthermore, the same applies to the column electrodes 92, in other words, the column electrodes 92 (Y1, Y2, Y3) are electrically connected to each other at the end section 92a formed at the other side face of the laminated piezoelectric element 58, in such a manner that wiring can be connected to the column electrodes 92 through this end section 92a.

Figure 10:
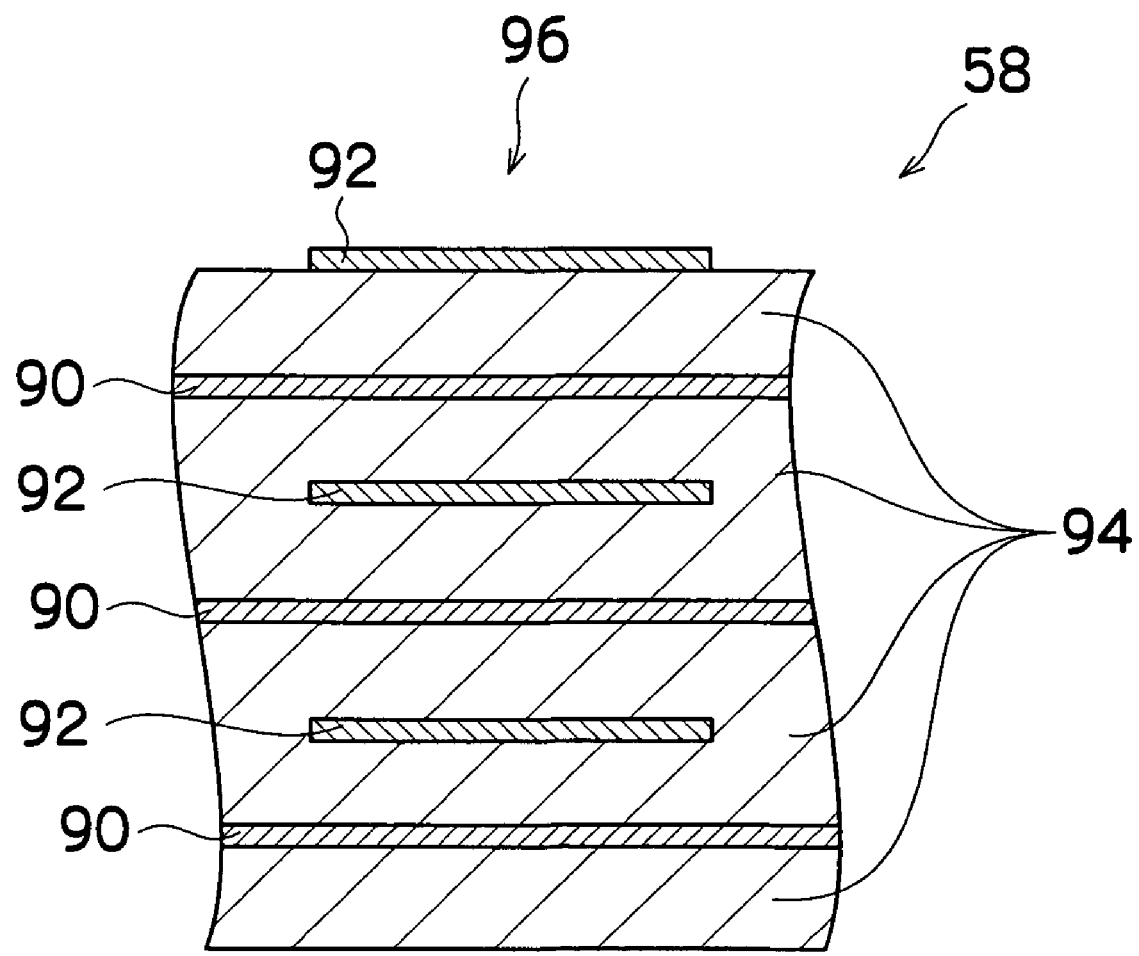
FIG. 10 is a cross-sectional view along line 10-10 in FIG. 9A.

FIG. 10 shows a cross-sectional view along line 10-10 of the intersection point 96 between the row electrodes 90 and the column electrodes 92 in FIG. 9A. As shown in FIG. 10, at the intersection point 96 between the row electrodes 90 and the column electrodes 92 in the laminated piezoelectric element 58, the row electrodes 90 and the column electrodes 92 are layered alternately via piezoelectric bodies 94, and there are piezoelectric bodies 94 between the row electrodes 90 and the column electrodes 92.

Of the row electrodes 90 and the column electrodes 92, one set of electrodes are common electrodes and the other set of electrodes are individual electrodes. For example, when a voltage is applied to the row electrode Xi, and the column electrode Yj is selected and a voltage is applied to the column electrode Yj, then ink is ejected from the pressure chamber 52 located at the position (i, j) of these two electrodes (the ith electrode from the bottom and the jth electrode from the left in FIG. 8 or FIG. 3). In this way, it is possible to freely drive any of the active parts which are arranged in the two-dimensional matrix array.

Furthermore, it is possible to simultaneously drive each of the columns Y1, . . . , Yn of the column electrodes 92 with respect to the row X1 of the row electrodes 90. Hence, the voltage is switched on to the row electrodes 90 of row X1 (rows X2, . . . Xm being switched off), and by selecting the column electrodes 92 corresponding to a nozzle from which ink is to be ejected with respect to this row (X1), from among those of the rows Y1, . . . , Yn, then ink is ejected from the specific nozzle located on row X1.

Next, the voltage is switched on to the row electrodes 90 of row X2 (the voltage is switched off to all of the row electrodes 90 other than those of row X2), and by selecting a column electrode 92 corresponding to a nozzle from which ink is to be ejected with respect to this row (X2), from among those of the rows Y1, . . . , Yn, then ink is ejected from the specific nozzle located on row X2.

Thereafter, ink is ejected sequentially from the nozzles in rows X3 to Xm, and when ink ejection has finished, the recording paper 16 is conveyed and ink ejection is driven again in a similar manner, starting again from row X1. Hence, the drive frequency is slower compared to a simple system in which each nozzle is provided with an individual electrode; however, a benefit is obtained in that the number of driving operations is reduced accordingly.

By driving the row electrodes 90 and the column electrodes 92 arranged in m rows and n columns in this way, ink is ejected from the nozzles 51 corresponding to the m×n pressure chambers 52, and hence an image is formed. In this case, since it is possible to connect respective wires through both the end portions 90a and 92a, the number of wires connected to the row electrodes 90 and the column electrodes 92 is the total, m+n, of m electrodes from the row electrodes 90 and n electrodes from the column electrodes 92. Therefore, it is possible to drive each of m×n individual electrodes (piezoelectric active parts) by means of the m+n wires. In this way, in the present embodiment, it is possible to reduce the number of wires connected to from the electrodes.

In the m+n driving method, it is possible to achieve a composition in which each pressure chamber is provided with a plurality of actuators, by separately connecting wires to the respective electrodes (row electrodes 90 and column electrodes 92) in the direction of lamination of the piezoelectric body. Furthermore, in this case, it is possible to control the ejection pressure generated in any one pressure chamber by independently driving the plurality of actuators laminated with respect to that pressure chamber, by means of the separately wired electrodes. Thus, the size of the ejected droplet of ink can be controlled, thereby making it possible to control the tonal gradation.

Moreover, it is also possible to use a portion of the plurality of actuators corresponding to one pressure chamber as an actuator for driving refill.

The laminated piezoelectric elements 58 may be formed into one general integrated composition in which piezoelectric bodies 94, row electrodes 90 and column electrodes 92 are layered in the sequential order as described above. Alternatively, a composition may be adopted in which a part or all of the unnecessary portions (inactive parts) 100, in which no row electrodes 90 and no column electrodes 92 are located and which are not used in driving, such as the region indicated by the thick frame lines in the corner section of the laminated piezoelectric element 58 in FIG. 9A, are removed by sandbrasting or the like. In this case, these unnecessary portions (inactive parts) 100 can be formed into a recessed shape or a perforated shape in such a manner that each of the active parts is able to be independently driven, and hence the displacement efficiency of the laminated piezoelectric elements 58 is improved.

Figure 9B:
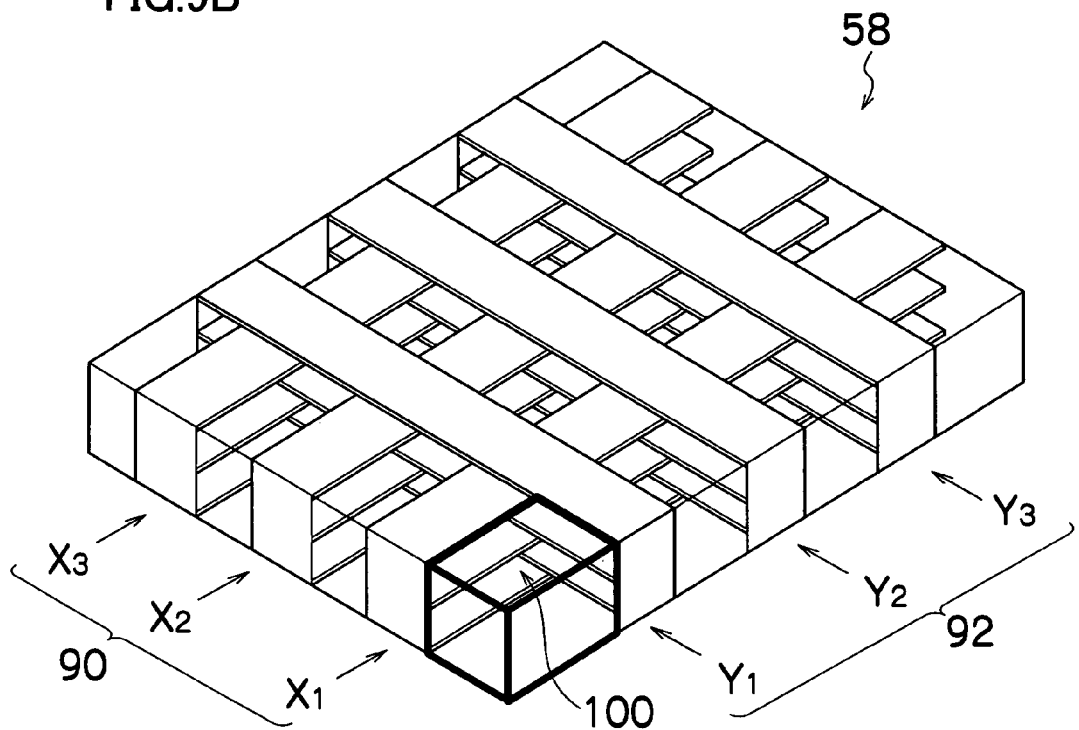
Figure 9C:
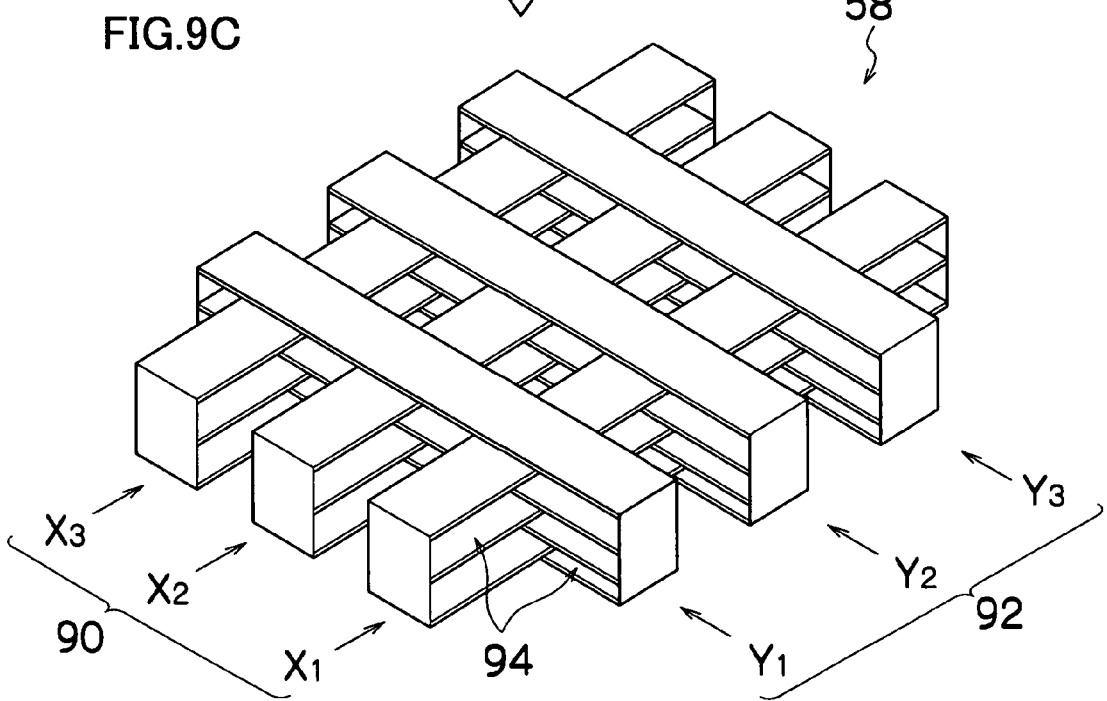

For example, it is also possible to remove the unnecessary portions such as the corner section of the laminated piezoelectric element 58 indicated by reference numeral 100 in FIG. 9B, where no row electrodes 90 and no column electrodes 92 are present, as shown in FIG. 9C. In this case, as shown in FIG. 9C, piezoelectric bodies 94 are laminated in between the respective layers formed by the plurality of laminated electrodes 90 and 92. In the embodiment shown in FIGS. 9B and 9C, the unnecessary portions 100, where none of the row electrodes 90 (X1, X2, X3) and the column electrodes 92 (Y1, Y2, Y3) are located, are removed completely from top to bottom, thereby forming a perforated shape. It is also possible to form the unnecessary portions 100 into a recessed shape in which the base region of the unnecessary portion is left, rather than completely removing it.

By adopting this composition, it is possible to prevent cross-talk between mutually adjacent active parts and/or interference between liquid droplets.

In the laminated piezoelectric element according to the first embodiment in which so-called active parts corresponding to pressure chambers are arranged in the two-dimensional matrix array, it is possible to wire the electrodes through the side faces, and therefore the electrode wiring can be connected readily, the number of the control circuits and the drivers can be reduced, and consequently, handling is improved.

It is possible to simultaneously drive the nozzles arranged on the same row electrode by arranging the electrodes in this fashion (see FIG. 8); however, if the patterns of the selected column electrodes are not the same between the adjacent row electrodes, then it may not be possible to simultaneously drive the adjacent row electrodes.

The laminated piezoelectric element according to a second embodiment which is described below serves to deal with this problem. FIG. 11 shows a laminated piezoelectric element according to the second embodiment.

FIG. 11 is a plan view that is similar to FIG. 8 shown above. As shown in FIG. 11, in the laminated piezoelectric element 158 of the second embodiment, the row electrodes and the column electrodes are respectively divided into two parts at the central regions of the laminated piezoelectric element 158, by means of a straight line parallel to the row direction and a straight line parallel to the column direction, as indicated by the dotted lines. In this case, by forming the row electrodes 190-1 and 190-2 and the column electrodes 192-1 and 192-2, the laminated piezoelectric element 158 is split into four blocks including an upper left block, an upper right block, a lower left block, and a lower right block. By dividing the electrodes in this fashion and connecting electrode wires through the end portions on either side of the blocks, the electrodes of the respective blocks can be independently driven, and hence it is possible to independently drive the nozzles corresponding to the electrodes of these respective different blocks.

As a result, it is possible to increase the number of electrodes that can be simultaneously driven, in other words, the number of nozzles which can be simultaneously driven, and hence printing can be performed at higher speed. The number of the divided regions of the electrodes which can each be independently driven in this way is not limited to four as shown in FIG. 11, and the number of nozzles which can be simultaneously driven can be increased by dividing the electrodes into any desired number of regions.

Next, the laminated piezoelectric element according to a third embodiment will be described.

FIG. 12 is an oblique perspective view showing the schematic composition of the laminated piezoelectric element according to the third embodiment. FIG. 12 shows the arrangement of the electrodes in particular, and the piezoelectric bodies sandwiched between these electrodes are omitted from the drawings.

As shown in FIG. 12, the laminated piezoelectric element 258 according to the present embodiment has two or more types of pattern electrodes in the lamination direction, as well as in the row direction and in the column direction. Of the row electrodes 290 arranged in the row direction, row X11, for example, comprises the electrodes that are provided with two parallel electrodes X11a and X11b (row electrodes) and form the electrode pairs activating the active parts together with column electrodes (described hereinafter). Electrodes X11-1, X11-3, and so on, forming the electrode pairs corresponding to the active parts, are arranged on the electrode X11b, and electrodes X11-2, and so on, similarly forming the electrode pairs corresponding to the active parts, are arranged on the electrode X11a. The electrodes (e.g., electrodes X11-1 and X11-3) formed on the electrode X11b and the electrodes (e.g., electrodes X11-2) formed on the electrode X11a are arranged alternately in a direction along the electrodes X11b or X11a, and they are arranged on every other of the active part.

Furthermore, the same applies to the column direction; namely, of the column electrodes 292, column Y11, for example, comprises the electrodes Y11-1, Y11-2, and so on, that are formed on two parallel electrodes Y11a and Y11b (column electrodes) and form the electrode pairs corresponding to the active parts Regarding the laminated structure of the row electrodes 290 and column electrodes 292 in FIG. 12, the upper four layers in the laminated structure are shown in FIGS. 13A to 13D, which show the layers separately.

Figure 13A:
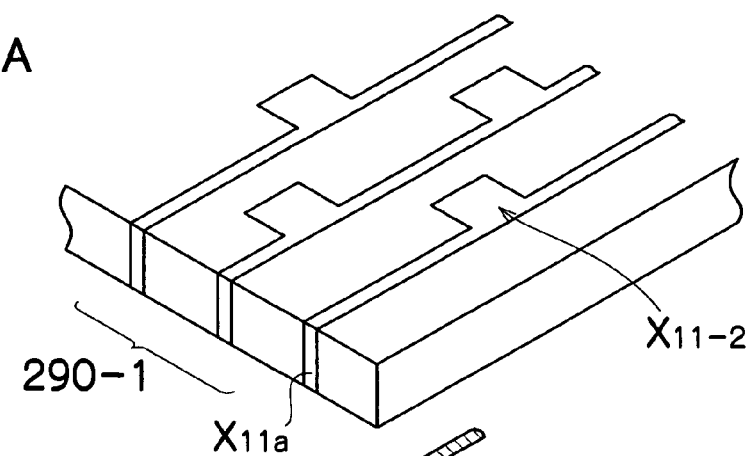
FIGS. 13A to 13D are exploded view showing the lamination structure of the electrodes forming the laminated piezoelectric element in FIG. 12.
Figure 13B:
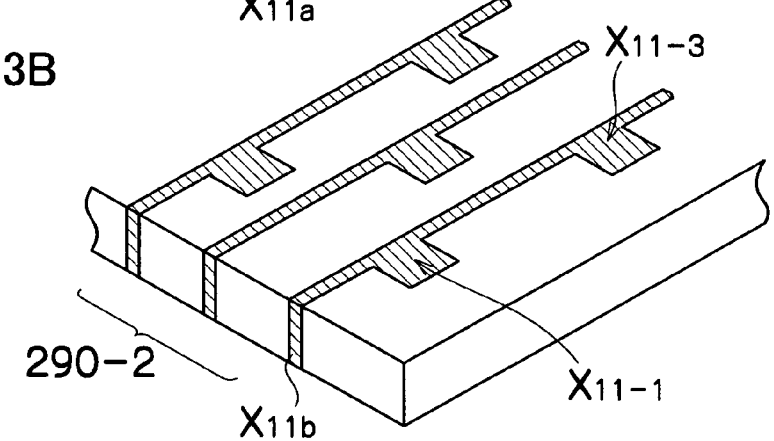

FIG. 13A shows the row electrodes 290-1, which form the electrodes in the uppermost layer in FIG. 12. For example, electrodes X11-2 and so on are arranged on the electrode X11a. FIG. 13B shows the row electrodes 290-2, which form the electrodes in the second layer from the top in FIG. 12. For example, electrodes X11-1, X11-3 and so on are arranged on the electrode X11b.

Figure 13C:
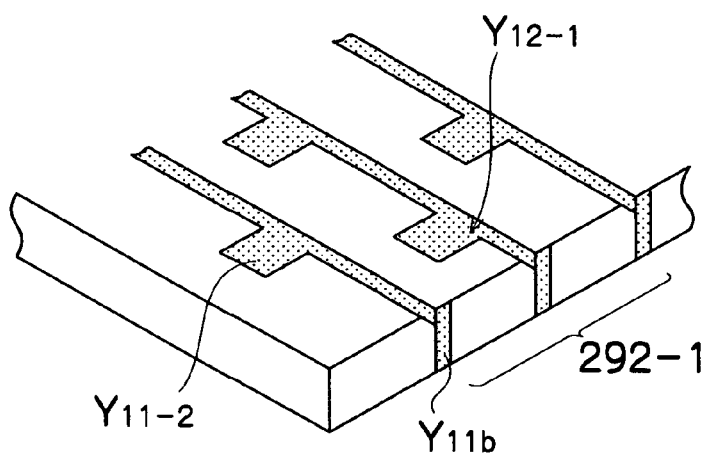
Figure 13D:
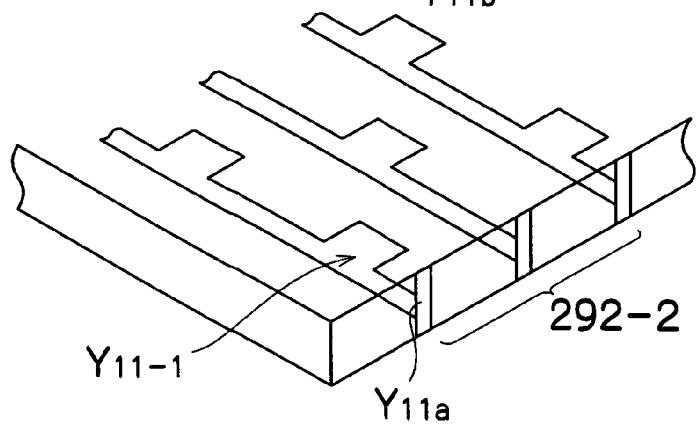

FIG. 13C shows the column electrodes 292-1, which form the electrodes in the next layer below the layer shown in FIG. 13B. For example, electrodes Y11-2 and so on are formed on the electrode Y11b. Furthermore, FIG. 13D shows the column electrodes 292-2, which form the electrodes in the further layer below the layer shown in FIG. 13C. For example, electrodes Y11-1 and so on are formed on the electrode Y11a.

In this way, the row electrodes 290-1, 290-2 and so on, and the column electrodes 292-1, 292-2 and so on, are layered via piezoelectric bodies (not shown) which are placed between the row electrodes and the column electrodes, and hence the laminated piezoelectric element 258 is formed as shown in FIG. 12. As shown in FIG. 12, the electrode pair is formed by arranging the electrode Y11-1 formed on the column electrode Y11 below the electrode X11-1 formed on the row electrode X11, and similarly, another row electrode and another column electrode forming another electrode pair are arranged below this.

Moreover, the electrode pair is formed by arranging the electrode Y12-1 formed on the column electrode Y12 below the electrode X11-2 formed on the row electrode X11, and furthermore, the electrode pair is formed by arranging the electrode Y11-2 formed on the column electrode Y11 below the electrode X12-1 formed on the row electrode X12. In all of these cases, further another row electrode and another column electrode forming another electrode pair are arranged below this.

Figure 14:
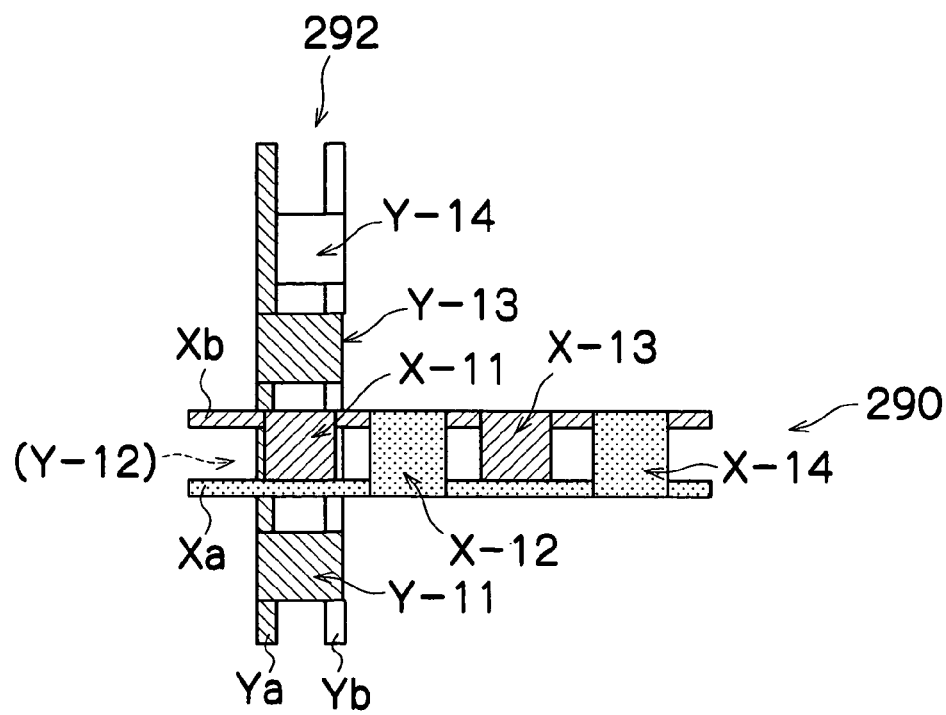
FIG. 14 is a plan view showing a typical view of an arrangement of row electrodes and column electrodes.

FIG. 14 is a plan view showing a typical arrangement of the row electrodes 290 and the column electrodes 292. Electrodes X-12 and X-14 are formed on the electrode Xa forming a row electrode 290, and similarly, electrodes X-11 and X-13 are formed on the electrode Xb. Moreover, the electrodes (X-12, X-14, and so on) formed on the electrode Xa, and the electrodes (X-11, X-13, and so on) formed on the electrode Xb are arranged alternately in a direction along the electrodes Xa or Xb, and they are arranged on every other of the active part.

Furthermore, the same applies to the column electrode 292, in which the electrodes Y-11 and Y-13 formed on the electrode Ya, and the electrodes Y-12 and Y-14 formed on the electrode Yb are arranged alternately in a direction along the electrodes Ya or Yb, and are arranged on every other of the active part. The electrode Y-12 formed on the electrode Yb is disposed below the electrode X-11 of the row electrodes 290, and hence the electrode Y-12 is not shown in FIG. 14.

Figure 15:
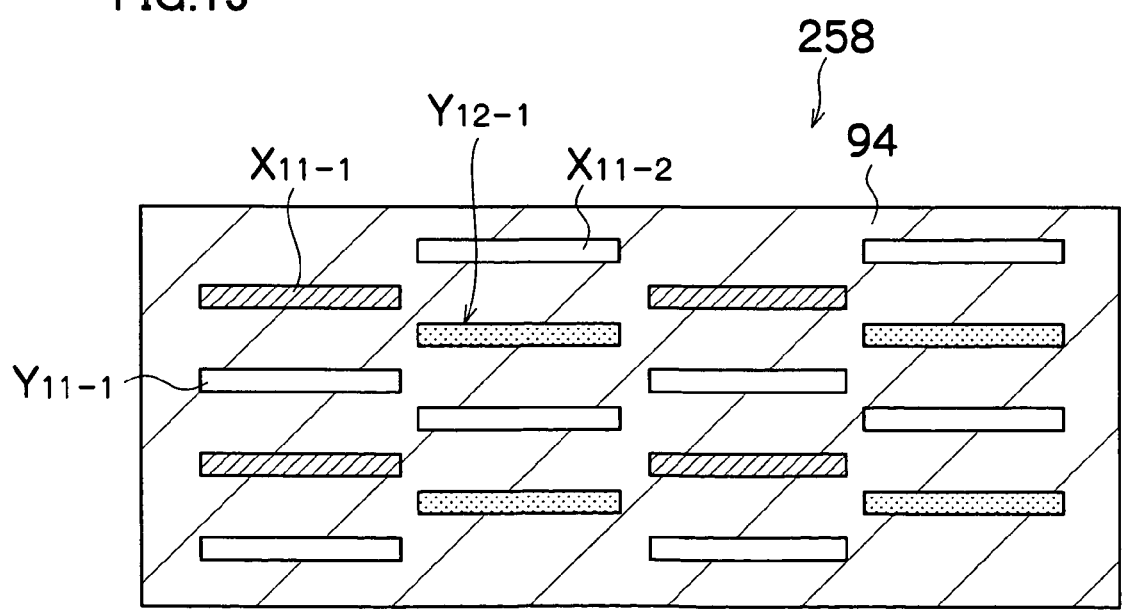
FIG. 15 is a cross-sectional view showing a typical view of a lamination structure of row electrodes and column electrodes.
Figure 16A:
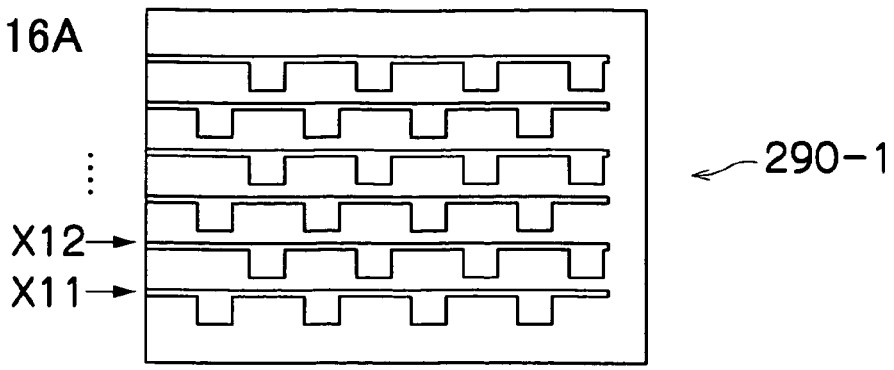
FIGS. 16A to 16D are explanation drawings showing the lamination sequence of electrode layers forming a third embodiment of the laminated piezoelectric element.
Figure 16B:
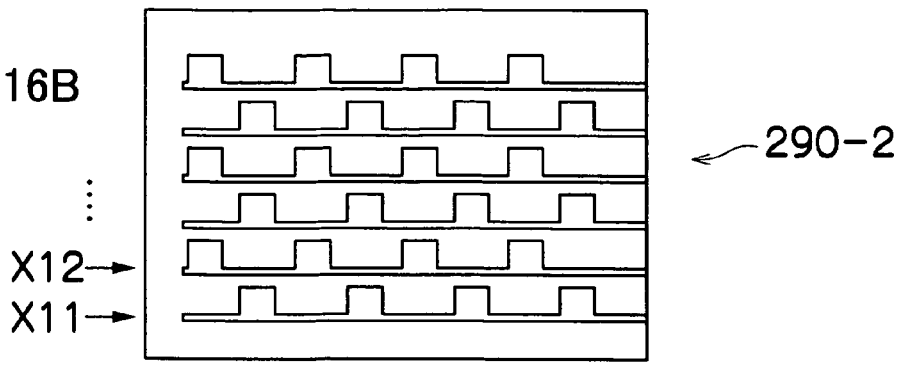
Figure 16C:
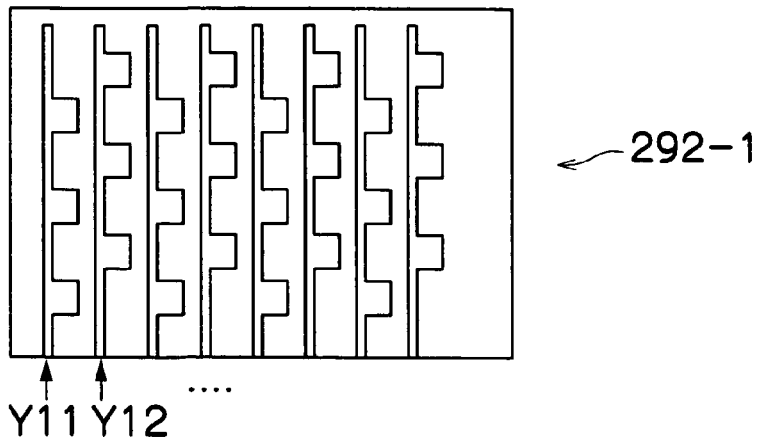
Figure 16D:
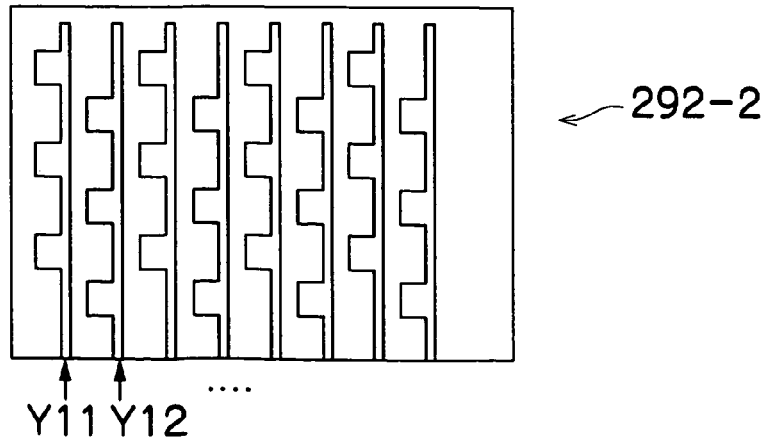

While FIG. 14 is a plan view, FIG. 15 shows a partial cross-sectional view along the row electrode X11 in FIG. 12, for example. As shown in FIG. 15, the row electrodes and the column electrodes are layered alternately, having a piezoelectric body 94 sandwiched between them.

FIGS. 13A to 13D show the lamination structure of the respective electrodes, but FIGS. 16A to 16D show how these lamination structures are actually formed. In the actual manufacture of the laminated piezoelectric element, green-sheets formed with respective electrode patterns and thin film piezoelectric bodies are taken and alternately layered in order. FIGS. 16A to 16D indicate the order of this lamination, in which the row electrodes 290-1, row electrodes 290-2, column electrodes 292-1 and column electrodes 292-2 are layered in sequence.

The two row electrodes 290-1 and 290-2 and the two column electrodes 292-1 and 292-2 layered together form one set of four laminated layers, and furthermore, two of these sets are layered together. The row electrodes in the first set are referred to as a Row Electrode 1, the column electrodes in the first set are referred to as a Column Electrode 1, the row electrodes in the second set are referred to as a Row Electrode 2, and the column electrodes in the second set are referred to as a Column Electrode 2. In this way, the electrodes in the lamination direction (T direction) can be used as well as the electrodes in the row direction and the column direction, and thus the piezoelectric element can be driven in an arrangement which prevents cross-talk or liquid-droplets-interference caused, for instance, by mixing between liquid droplets deposited in adjacent positions on the recording paper 16.

Figure 17:
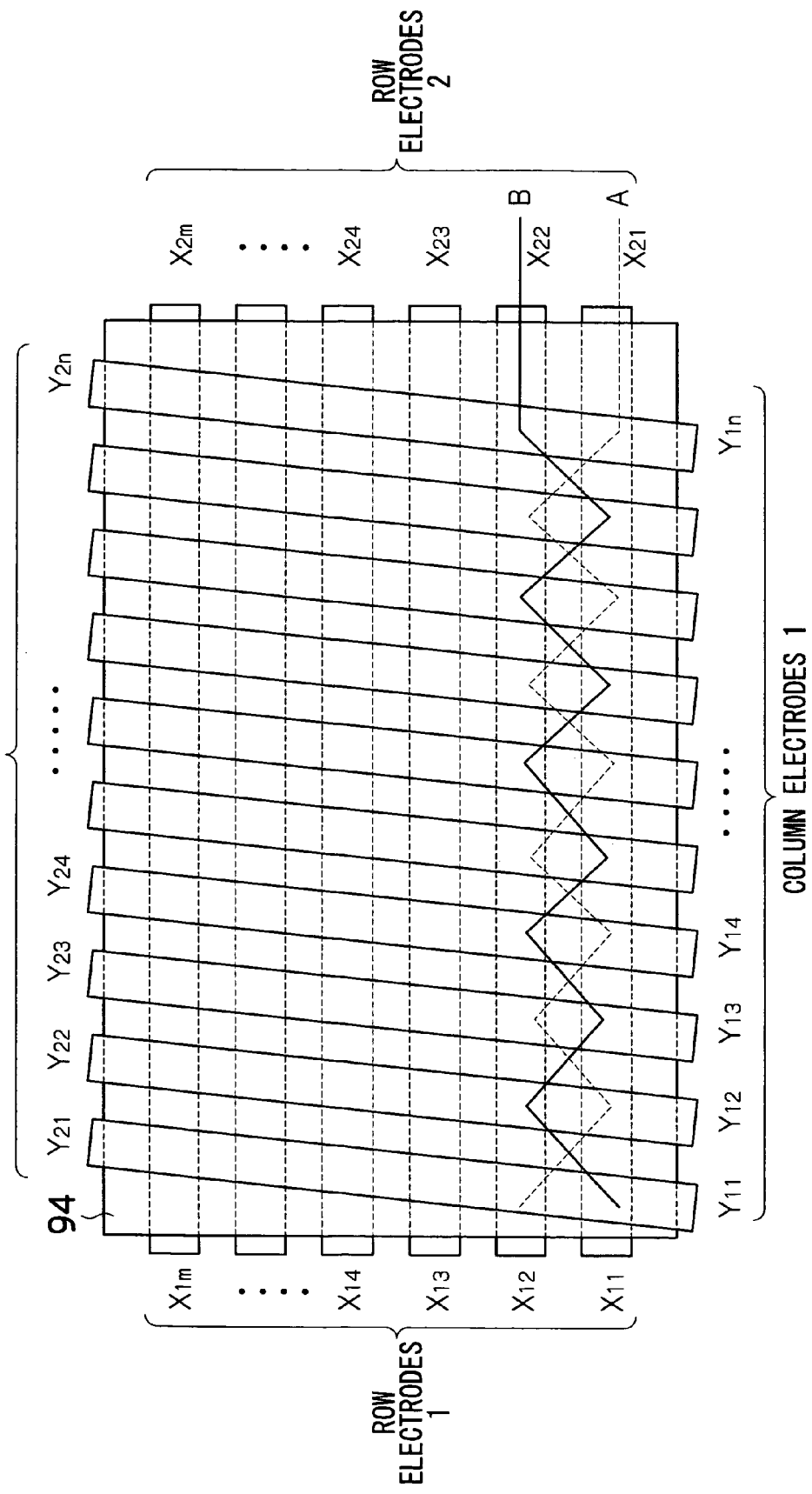
FIG. 17 is an explanation drawing showing one example of a method of driving a third embodiment of the laminated piezoelectric element.

FIG. 17 shows one embodiment of this kind of a driving method.

For example, in FIG. 12, if the electrodes X11a and X12a are connected to each other in such a manner that the electrodes X12-1, X11-2, X12-3, and the like, formed on the electrodes X11a and X12a can be simultaneously driven, then the electrodes on the jagged line indicated by the broken line A in FIG. 17 can be simultaneously driven.

Furthermore, in FIG. 12, if the electrodes X11b and X12b are connected to each other in such a manner that the electrodes X11-1, X12-2, X11-3, and the like, formed on the electrodes X11b and X12b can be simultaneously driven, then the electrodes on the jagged line indicated by the solid line B in FIG. 17 can be simultaneously driven.

By devising the electrode connections (electrode wiring) in this way, it is possible to ensure that the electrodes which are mutually adjacent in the same row direction do not simultaneously drive the piezoelectric element, and hence cross-talk and droplet interference can be prevented.

Next, a method for driving electrodes in the T direction (the lamination direction or an oblique direction), which is a third direction in addition to the row direction and column direction described above, is explained below with reference to the drawings.

Figure 18:
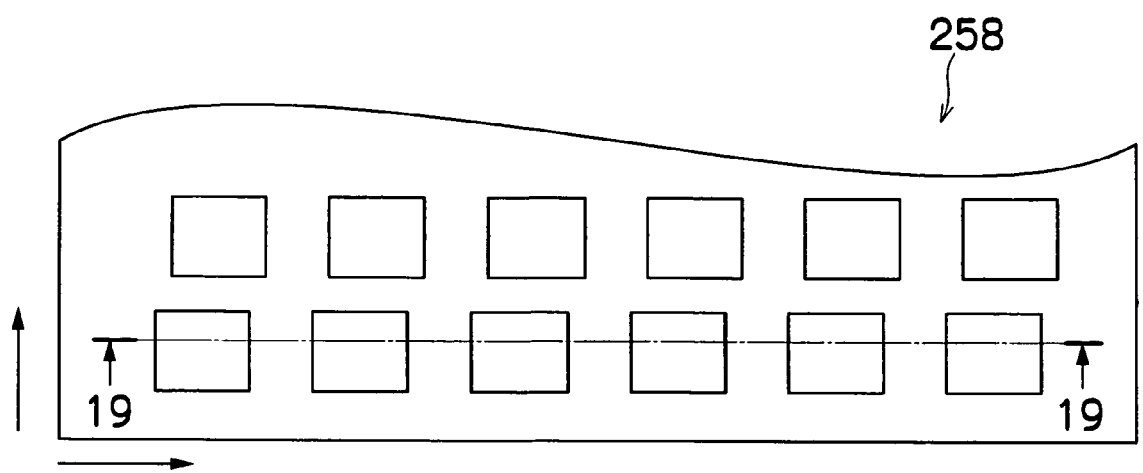
FIG. 18 is a plan view showing a method of arranging the electrodes of the laminated piezoelectric element.

FIG. 18 is a plan view of a laminated piezoelectric element 258, showing a situation where the active parts of a laminated piezoelectric element formed by layering electrode layers via piezoelectric bodies over respective pressure chambers are arranged in the row direction and the column direction.

Figure 19:
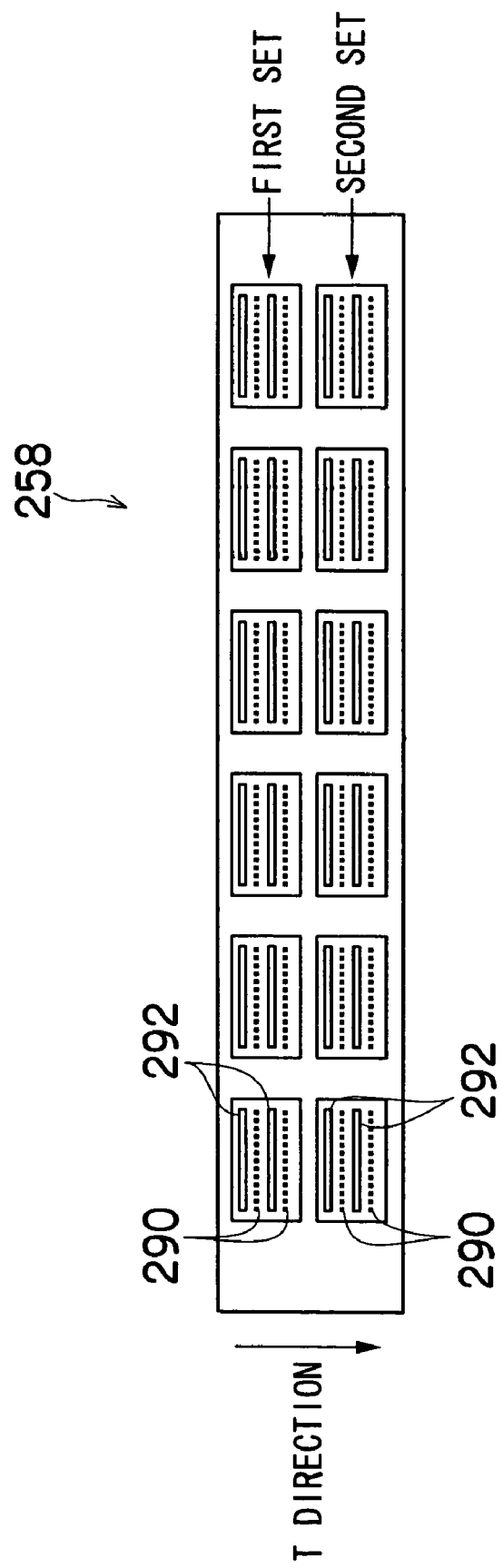
FIG. 19 is a cross-sectional view along line 19-19 in FIG. 18, showing a state of the plurality of sets of electrode layers laminated in the lamination direction.

FIG. 19 is a cross-sectional view along line 19-19 in FIG. 18. In the embodiment shown in FIG. 19, two sets (a first set and a second set) of electrode layers, each having four layers comprising two layers of row electrodes 290 and two layers of column electrodes 292, are laminated in the T direction.

By layering the electrodes in this manner and devising the wiring in such a manner that the electrodes can be independently driven in the T direction (lamination direction) as well as the row direction and the column direction, it is possible to prevent cross-talk and interference between the liquid droplets. Furthermore, if a plurality of sets of electrodes are layered in the lamination direction in such a manner that these sets can be independently driven, then it is also possible to use one of these sets of electrodes as sensors for determining the pressure of the ink inside the pressure chambers to evaluate the ejection state.

While two sets of the electrode layers are arranged in the lamination direction (T direction) in FIG. 19, it is also possible to laminate a third set, a fourth set, or further layers of electrodes. By laminating a plurality of electrode layers in the T direction in this way and independently driving each of these layers, it becomes possible to control the generated pressure in a plurality of stages, and hence the tonal gradation can be controlled readily. Furthermore, it is also possible to constitute actuators for driving refill.

According to the embodiments described above, the electrodes are arranged in the row direction and the column direction, and the wiring is derived from the side faces of the laminated piezoelectric element. Hence, it is possible to increase the number of rows and columns of electrodes. Moreover, since the matrix structure is adopted for the laminated structure, it is possible to generate greater pressure in comparison with a conventional single-plate piezoelectric element, and therefore, even ink of high viscosity can be ejected.

Moreover, by increasing the number of layers, a larger pressure can be generated by means of a low voltage. Furthermore, the device is easier to handle than a single plate structure when a single long head corresponding to a matrix arrangement is made.

Furthermore, since the matrix-drive is adopted by using the wiring arranged in the row direction and the column direction, the number of wires is reduced and the number of drivers can be reduced in comparison with the conventional art where one driver is required for each nozzle.

The laminated piezoelectric element according to the present invention, the liquid droplet ejection head using the laminated piezoelectric element, and the image forming apparatus using the liquid droplet ejection head have been described in detail above. It should be understood, however, that there is no intention to limit the scope of the invention to the specific forms disclosed, but on the contrary, the invention is to cover all modifications, alternate constructions and equivalents falling within the spirit and scope of the invention as expressed in the appended claims.

What is claimed is:

1. A laminated piezoelectric element, comprising a plurality of layers including first electrodes, piezoelectric material bodies, and second electrodes, wherein:
   the layers are laminated in order of the first electrode, the piezoelectric material body, the second electrode, and the piezoelectric material body;
   a plurality of active parts of the laminated piezoelectric element, where the piezoelectric material bodies are capable of actively expanding and contracting when a voltage is applied to the first electrode and the second electrode that are mutually opposing across the piezoelectric material body, are two-dimensionally arranged in a row direction and a column direction wherein,
   the first electrodes and second electrodes are arranged to intersect obliquely;
   the first electrodes are common to the plurality of active parts in the row direction and the second electrodes are common to the plurality of active parts in the column direction;
   the first electrodes arranged in the row direction further comprise two parallel row electrodes to form a row electrode pair that activates the active parts together with a column electrode pair; and
   the second electrodes arranged in the column direction further comprise two parallel column electrodes to form the column electrode pair that activates the active parts together with the row electrode pair wherein
   portions of the two parallel row electrodes forming the row electrode pair corresponding to the active parts are arranged to alternately correspond to the plurality of active parts in terms of the row direction;
   portions of the two parallel column electrodes forming the column electrode pair corresponding to the active parts are arranged to alternately correspond to the plurality of active parts in terms of column direction; and
   electrode pairs formed by the first electrodes and the second electrodes are not only arranged two-dimensionally in the row direction and the column direction but also superimposed to each other in a lamination direction that is perpendicular to the row direction and the column direction, in such a manner that each of the layers is independently drivable.

2. The laminated piezoelectric element as defined in claim 1, wherein the first electrodes and the second electrodes are connected to wiring through end faces of the laminated piezoelectric element.

3. The laminated piezoelectric element as defined in claim 1, wherein at least a portion of inactive parts that are not activated by application of voltage to the first electrode and the second electrode is formed into one of a recessed shape and a perforated shape.

4. The laminated piezoelectric element as defined in claim 1, wherein electrode pairs formed by the first electrodes and the second electrodes arranged in a two-dimensional arrangement are divided into a plurality of regions that are drivable independently from each other.

5. The laminated piezoelectric element as defined in claim 4, wherein the plurality of regions are obtained by dividing into four regions by means of a line parallel to the row direction and a line parallel to the column direction, the two lines passing through a substantial central portion of the two-dimensional arrangement.

6. The laminated piezoelectric element as defined in claim 1, wherein two of the first electrodes that are arranged adjacently in the row direction are arranged in a staggered fashion and connected so as to be simultaneously driven.

7. A liquid droplet ejection head, comprising a drive actuator including the laminated piezoelectric element as defined in claim 1.

8. An image forming apparatus, comprising the liquid droplet ejection head as defined in claim 7.

9. The laminated piezoelectric element as defined in claim 1, wherein the first electrodes and second electrodes are arranged to intersect obliquely at an angle slightly less than 90°.

10. A laminated piezoelectric element, comprising a plurality of layers including first electrodes, piezoelectric material bodies, and second electrodes, wherein:

the layers are laminated in order of a first electrode, a piezoelectric material body, a second electrode, and a piezoelectric material body;

a plurality of active parts of the laminated piezoelectric element, where the piezoelectric material bodies are capable of actively expanding and contracting when a voltage is applied to the first electrode and the second electrode that are mutually opposing across the piezoelectric material body, are two-dimensionally arranged in a row direction and a column direction, wherein the first electrodes and second electrodes are arranged to intersect obliquely;

the first electrodes are common to the plurality of active parts in the row direction and the second electrodes are common to the plurality of active parts in the column direction;

the active parts arranged two-dimensionally in the laminated piezoelectric element are split into at least two regions wherein each region is driven independently to drive the nozzles corresponding to the electrodes of different; and electrode pairs formed by the first electrodes and the second electrodes are not only arranged two-dimensionally in the row direction and the column direction but also superimposed to each other in a lamination direction that is perpendicular to the row direction and the column direction, in such a manner that each of the layers is independently drivable.

* * * * *